(12) United States Patent
Maehara

(10) Patent No.: US 12,288,719 B2
(45) Date of Patent: Apr. 29, 2025

(54) SEMICONDUCTOR DEVICE MANUFACTURING PROCESS INCLUDING FORMING A BONDED ASSEMBLY AND SUBSTRATE RECYCLING

(71) Applicant: SANDISK TECHNOLOGIES LLC, Addison, TX (US)

(72) Inventor: Takuya Maehara, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 540 days.

(21) Appl. No.: 17/659,057

(22) Filed: Apr. 13, 2022

(65) Prior Publication Data

US 2023/0335441 A1    Oct. 19, 2023

(51) Int. Cl.
| | | |
|---|---|---|
| H01L 21/78 | (2006.01) | |
| H01L 23/00 | (2006.01) | |
| H01L 25/00 | (2006.01) | |
| H01L 25/065 | (2023.01) | |
| H01L 25/18 | (2023.01) | |

(52) U.S. Cl.
CPC .......... H01L 21/7813 (2013.01); H01L 24/08 (2013.01); H01L 24/80 (2013.01); H01L 25/0657 (2013.01); H01L 25/18 (2013.01); H01L 25/50 (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..... H01L 21/7813; H01L 24/08; H01L 24/80; H01L 25/0657; H01L 25/18; H01L 25/50; H01L 2224/08145; H01L 2224/80895; H01L 2224/80896; H01L 2924/1431; H01L 2924/14511; H01L 21/7806; H01L 21/78; H10B 41/27; H10B 43/27
See application file for complete search history.

(56) References Cited

U.S. PATENT DOCUMENTS 5,915,167 A      6/1999   Leedy
6,807,332 B1 *  10/2004   Hawwa ................. G02B 6/359
                                                               385/18

(Continued)

*Primary Examiner* — Ismail A Muse
*Assistant Examiner* — Felix B Andrews
(74) *Attorney, Agent, or Firm* — THE MARBURY LAW GROUP PLLC

(57) ABSTRACT

A method includes forming an etch stop material layer and a planar sacrificial spacer layer over a front surface of a first substrate, forming an insulating encapsulation layer over the planar sacrificial spacer layer and on a backside surface and a side surface of the first substrate, forming a continuous structure including first semiconductor devices over a top surface of the insulating encapsulation layer, etching inter-die trenches within the continuous structure to divide the continuous structure, bonding the divided continuous structure to second semiconductor devices located over a second substrate, selectively removing the planar sacrificial spacer layer by performing a wet etch process in which an isotropic etchant is introduced into the inter-die trenches, and detaching the first substrate from an assembly of the second substrate, the second semiconductor devices, and the divided continuous structure after the removing the planar sacrificial spacer layer.

9 Claims, 13 Drawing Sheets

(56) References Cited

U.S. PATENT DOCUMENTS

| | | | |
|---|---|---|---|
| 10,354,980 B1* | 7/2019 | Mushiga | H01L 21/76898 |
| 10,629,616 B1 | 4/2020 | Kai et al. | |
| 10,790,300 B2 | 9/2020 | Rajashekhar et al. | |
| 10,797,060 B2 | 10/2020 | Sharangpani et al. | |
| 10,797,061 B2 | 10/2020 | Nishida et al. | |
| 10,910,272 B1 | 2/2021 | Zhou et al. | |
| 11,114,453 B2* | 9/2021 | Yang | H10B 43/27 |
| 11,195,781 B2 | 12/2021 | Okina et al. | |
| 11,195,857 B2 | 12/2021 | Kai et al. | |
| 11,201,107 B2 | 12/2021 | Okina et al. | |
| 11,239,253 B2 | 2/2022 | Rajashekhar et al. | |
| 2004/0209419 A1* | 10/2004 | Konishi | H10B 10/15 257/E21.582 |
| 2008/0073690 A1* | 3/2008 | Baek | H01L 29/40114 257/314 |
| 2012/0168914 A1* | 7/2012 | Wuu | H01L 21/02002 257/618 |
| 2012/0217468 A1* | 8/2012 | Tekleab | H01L 29/0676 438/270 |
| 2019/0172709 A1* | 6/2019 | Odnoblyudov | H01L 21/84 |
| 2019/0252304 A1* | 8/2019 | Chang | H01L 23/3114 |
| 2020/0027951 A1* | 1/2020 | Hebert | H01L 21/0245 |
| 2020/0335487 A1 | 10/2020 | Rajashekhar et al. | |
| 2020/0335516 A1 | 10/2020 | Rajashekhar et al. | |
| 2020/0388626 A1 | 12/2020 | Baraskar et al. | |
| 2020/0388688 A1 | 12/2020 | Baraskar et al. | |
| 2021/0035965 A1 | 2/2021 | Mizutani et al. | |
| 2021/0082865 A1* | 3/2021 | Baraskar | H01L 25/0657 |
| 2021/0091063 A1 | 3/2021 | Ninomiya et al. | |
| 2021/0408032 A1 | 12/2021 | Baraskar et al. | |
| 2021/0408033 A1 | 12/2021 | Baraskar et al. | |
| 2023/0260845 A1* | 8/2023 | Kweon | H01L 23/3114 257/777 |

* cited by examiner

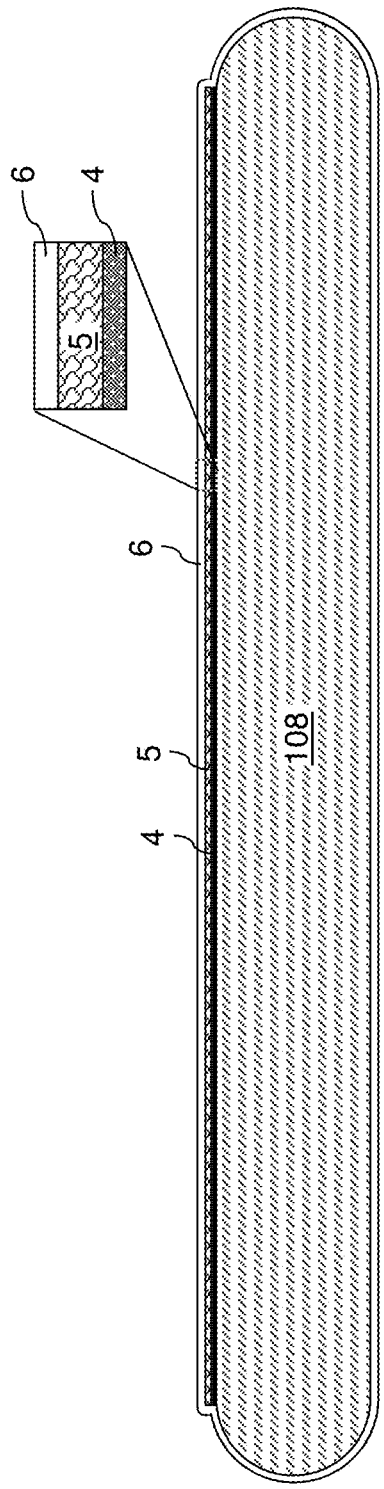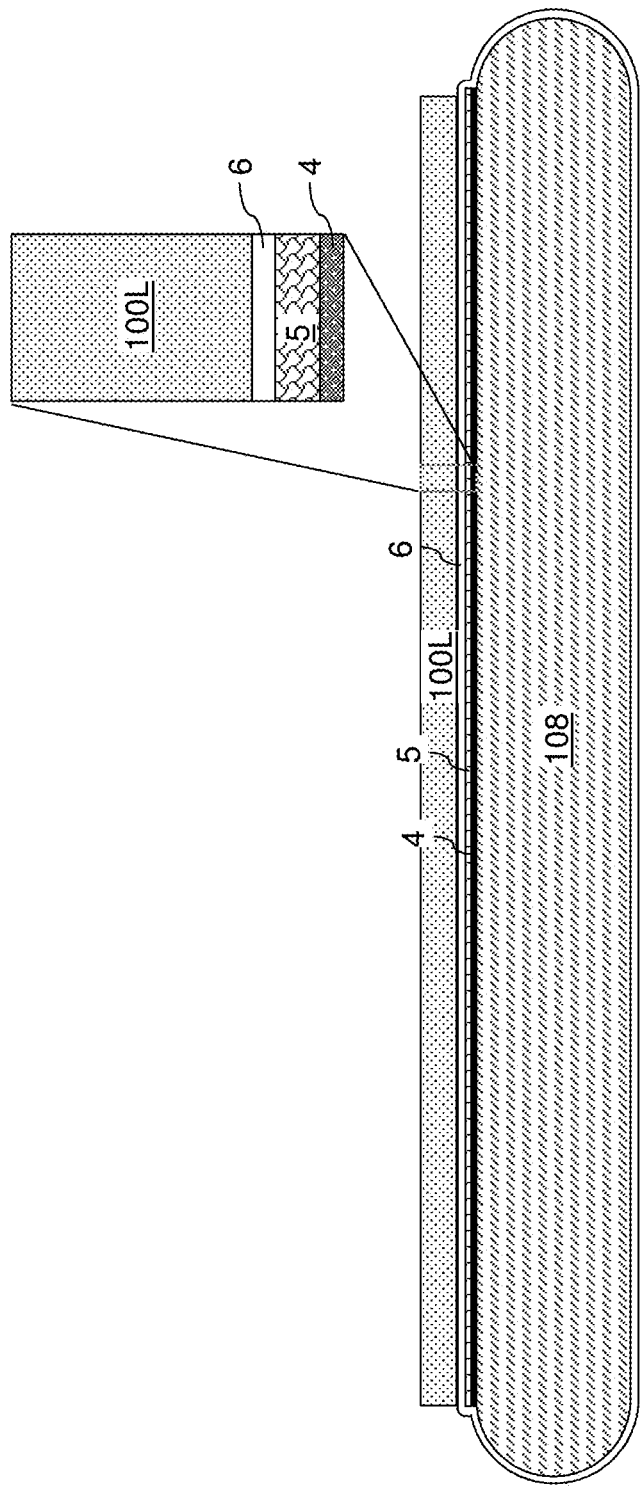

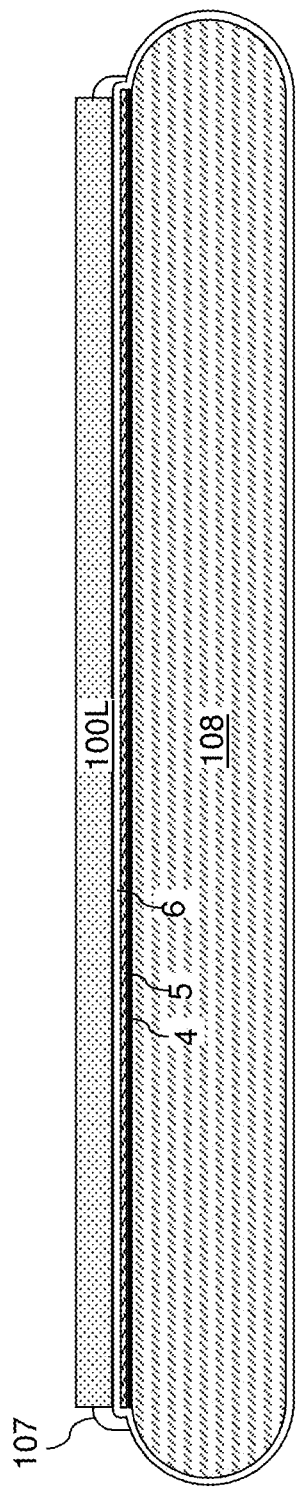
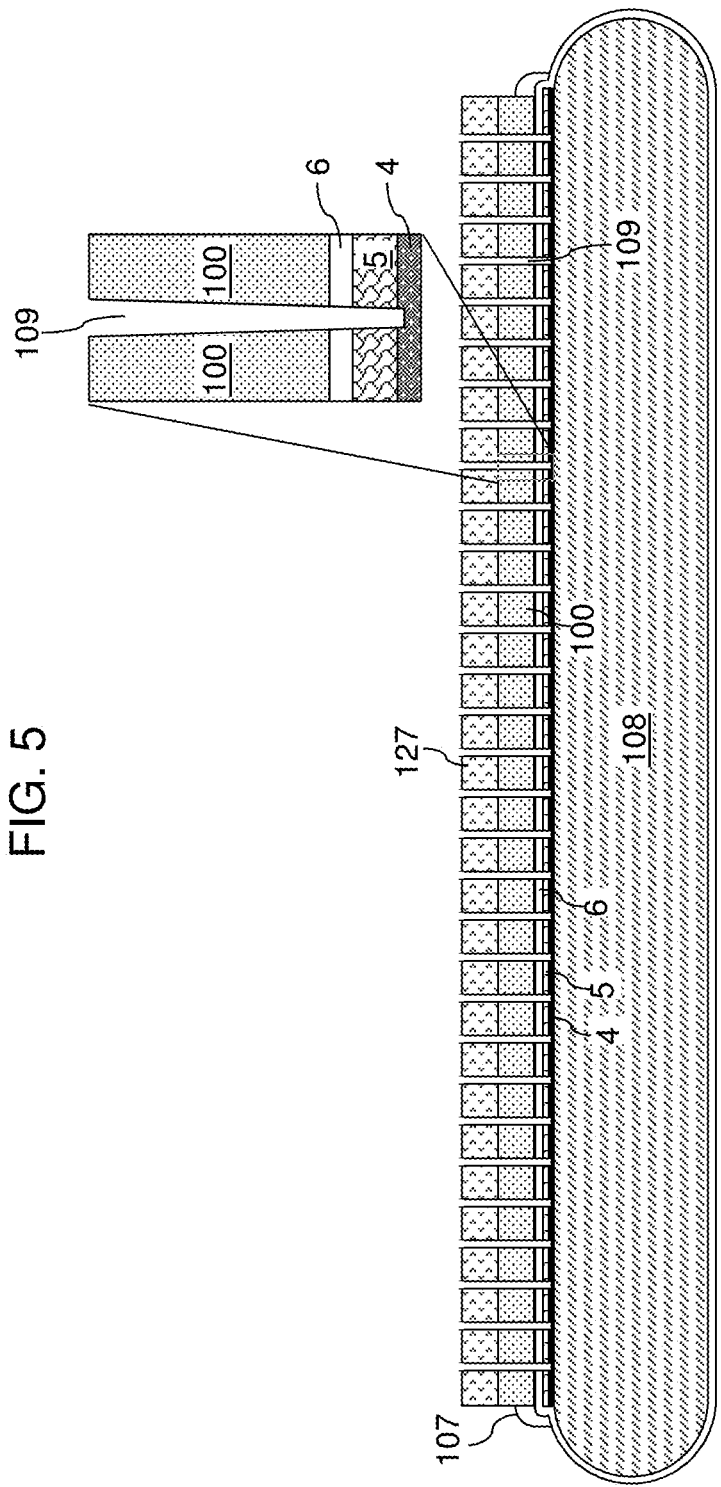
FIG. 5
FIG. 6A

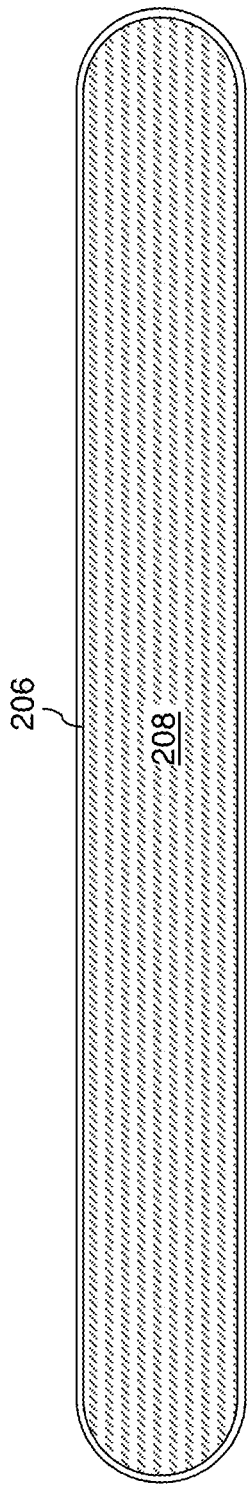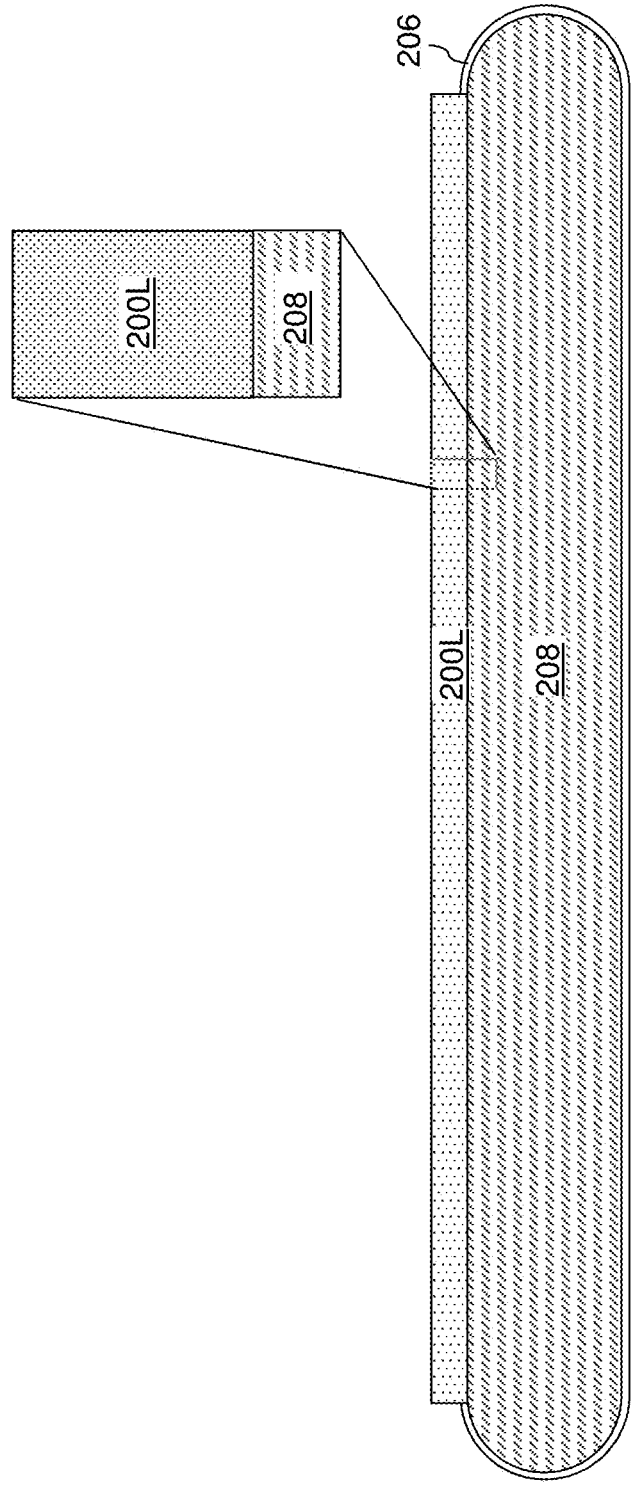

US 12,288,719 B2

SEMICONDUCTOR DEVICE MANUFACTURING PROCESS INCLUDING FORMING A BONDED ASSEMBLY AND SUBSTRATE RECYCLING

FIELD

The present disclosure relates generally to the field of semiconductor devices, and particularly to a semiconductor device manufacturing process that include forming a bonded assembly and substrate recycling.

BACKGROUND

Two substrates with respective semiconductor devices thereupon can be bonded to form a bonded assembly. Electrical contacts to the semiconductor devices are typically formed by thinning at least one of the substrates by grinding before dicing the assembly.

SUMMARY

According to an aspect of the present disclosure, a method includes forming an etch stop material layer and a planar sacrificial spacer layer over a front surface of a first substrate, forming an insulating encapsulation layer over the planar sacrificial spacer layer and on a backside surface and a side surface of the first substrate, forming a continuous structure including first semiconductor devices over a top surface of the insulating encapsulation layer, etching inter-die trenches within the continuous structure to divide the continuous structure, bonding the divided continuous structure to second semiconductor devices located over a second substrate, removing the planar sacrificial spacer layer selective to the etch stop material layer and the insulating encapsulation layer by performing a wet etch process in which an isotropic etchant is introduced into the inter-die trenches, and detaching the first substrate from an assembly of the second substrate, the second semiconductor devices, and the divided continuous structure after the removing the planar sacrificial spacer layer.

BRIEF DESCRIPTION OF THE DRAWINGS

FIG. 3 is a schematic vertical cross-sectional view of the first substrate after formation of a first insulating encapsulation layer according to an embodiment of the present disclosure.

FIG. 4A is a schematic vertical cross-sectional view of the first substrate after formation of a continuous structure including semiconductor devices therein according to an embodiment of the present disclosure.

FIG. 5 is a schematic vertical cross-sectional view of the first substrate after formation of an optional first protective annular spacer according to an embodiment of the present disclosure.

FIG. 6A is a schematic vertical cross-sectional view of the first substrate after formation of inter-die trenches that divide the continuous structure into a two-dimensional array of first semiconductor dies according to an embodiment of the present disclosure.

FIG. 7 is a schematic vertical cross-sectional view of a second substrate after formation of a second insulating encapsulation layer.

FIG. 8 is a schematic vertical cross-sectional view of the second substrate after removal of a horizontal portion of the second insulating encapsulation layer and formation of a device layer including an array of second semiconductor dies according to an embodiment of the present disclosure.

DETAILED DESCRIPTION

Figure 1:
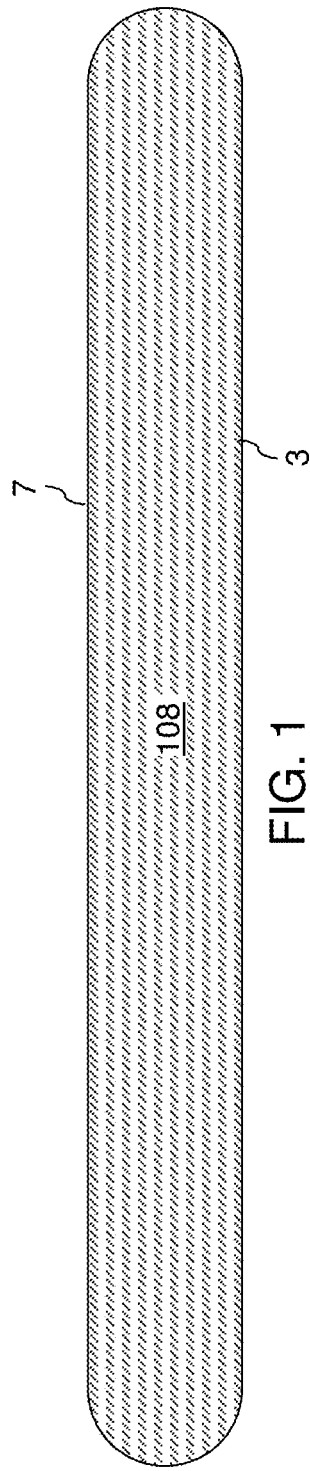
FIG. 1 is a schematic vertical cross-sectional view of a first substrate as provided according to an embodiment of the present disclosure.

Embodiments of the present disclosure are directed to a semiconductor device manufacturing process that includes forming a bonded assembly and substrate recycling, the various aspects of which are described herein in detail. The substrate recycling reduces process cost, and avoids substrate thinning by grinding, which places a stress of the semiconductor devices.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first substrate 108 according to an embodiment of the present disclosure is illustrated in a vertical cross-sectional view. The first substrate 108 can be a semiconductor substrate such as a commercially available silicon wafer having a maximum lateral dimension in a range from 100 mm to 450 mm, and having a thickness in a range from 300 microns to 2 mm, although lesser and greater diameters and/or thicknesses can also be employed.

In one embodiment, the first substrate 108 can consist essentially of a semiconductor material such as single crystalline silicon, polysilicon, silicon carbide, a III-V compound semiconductor material such as GaN or AlGaN, a II-VI compound semiconductor material, or an organic semiconductor material. Alternatively, the first substrate 108 may comprise an insulating substrate, such as a ceramic, quartz or glass substrate. In one embodiment, the first substrate 108 may have a horizontal cross-sectional shape of a circle, a rectangle, or any closed two-dimensional curvilinear shape. In one embodiment, the first substrate 108 may be a commercially available single crystalline substrate having a circular or quasi-circular horizontal cross-sectional shape, such as a 300 mm single crystalline silicon substrate or a 450 mm single crystalline silicon wafer. The wafer may have one or more optional wafer flats (not shown for clarity), such that the wafer has a quasi-circular (i.e., circle with one or more flat sides) horizontal cross-sectional shape due to the presence of the wafer flat(s).

The first substrate 108 can have a front-side major substrate 7 and a backside major substrate 3. As used herein, a "major surface" of an element refers to a surface of the element that has a surface area of at least 50% of a surface of the element that has the largest surface area. The front surface 7 is a major surface located on a front side of the first substrate 108, and the backside surface 3 is a major surface located on a backside of the first substrate 108. The front surface 7 of the first substrate 108 can include a tapered peripheral surface portion located at a peripheral region (e.g., edge region) of the front surface 7. The peripheral region can include the entire area of the front surface 7 that has a non-horizontal surface segment. As used herein, a "surface segment" refers to any finite segment of a surface. The tapered peripheral surface portion includes segments of the front surface 7 that are not horizontal. In one embodiment, the tapered peripheral surface portion of the front surface 7 can have an annular shape. In one embodiment, the peripheral region of the first substrate 108 includes a bevel region of the first substrate 108. As used herein, a "bevel region" refers to a region having a tapered front-side surface and/or a tapered backside surface to provide a lesser thickness than an adjacent region (i.e., a non-bevel region) having a uniform thickness.

Figure 2:
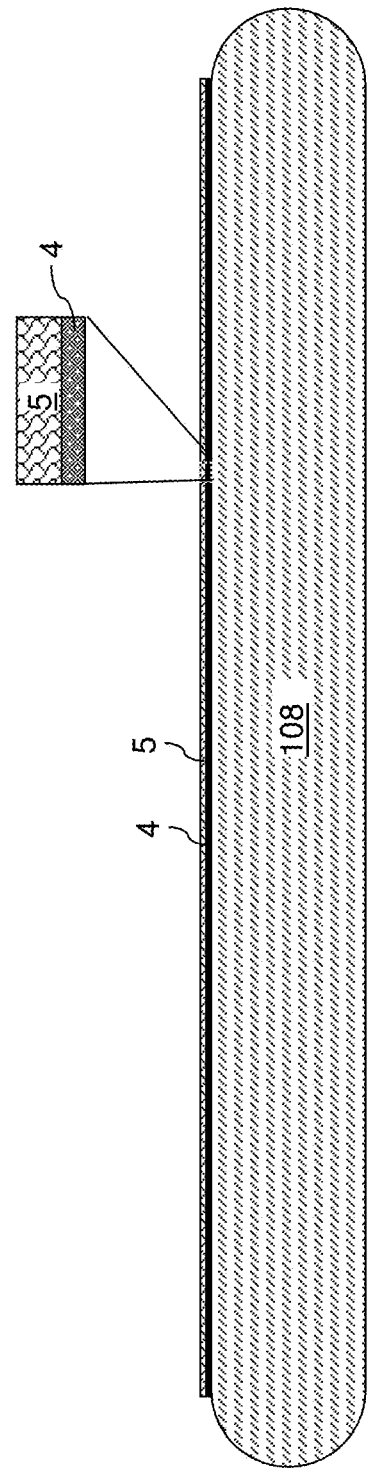
FIG. 2 is a schematic vertical cross-sectional view of the first substrate after formation of an etch stop material layer and a planar sacrificial spacer layer according to an embodiment of the present disclosure.

Referring to FIG. 2, an etch stop material layer 4 and a planar sacrificial spacer layer (e.g., a release layer) 5 can be deposited on the front surface 7 of the first substrate 108. The etch stop material layer 4 includes a material that can function as an etch stop material during a subsequent anisotropic etch process that forms inter-die trenches. Further, the etch stop material layer 4 includes a material that is different from the material of the planar sacrificial spacer layer 5 such that the planar sacrificial spacer layer 5 can be subsequently removed selective to the material of the etch stop material layer 4. In one embodiment, the etch stop material layer 4 may include a dielectric material such as silicon nitride, silicon carbide nitride, or a dielectric metal oxide material (such as aluminum oxide, hafnium oxide, tantalum oxide, lanthanum oxide, yttrium oxide, etc.). Alternatively, the etch stop material layer 4 may include a metal or metal alloy material layer, such as a tantalum layer, a tungsten layer, a molybdenum layer, a tantalum nitride layer, a titanium nitride layer, a tungsten nitride layer, a molybdenum nitride layer, etc. Optionally, a sacrificial adhesion promotion layer such as a thin silicon oxide layer may be formed on the front surface 7 of the first substrate 108 prior to formation of the etch stop material layer 4. In one embodiment, the etch stop material layer 4 comprises a silicon nitride layer.

In one embodiment, the etch stop material layer 4 may be formed by an anisotropic deposition process that deposits an etch stop material on the front surface 7 of the first substrate 108 and does not deposit the etch stop material on a backside surface 3 of the first substrate 108. For example, plasma-enhanced chemical vapor deposition (PECVD) process may be employed to deposit the etch stop material layer 4. The thickness of the etch stop material layer 4 may be in a range from 50 nm to 1,000 nm, such as from 100 nm to 500 nm, although lesser and greater thicknesses may also be employed.

The planar sacrificial spacer layer 5 is deposited over the etch stop material layer 4 over the front surface 7 of the first substrate 108. The planar sacrificial spacer layer 5 comprises a material that can be removed selective the etch stop material layer 4 and an overlying layer, such as an encapsulation layer to be deposited in a subsequent step. As used herein, a first material is removed "selective to" a second material if the removal rate of the first material is greater than the removal rate of the second material by a factor of at least three. The ratio of the etch rate of the first material to the etch rate of the second material is referred to as the "selectivity" of an etch process. According to an aspect of the present disclosure, the material of the planar sacrificial spacer layer 5 is selected such that the material of the planar sacrificial spacer layer 5 may be subsequently removed employing an isotropic etch process that etches the material of the planar sacrificial spacer layer 5 selective to the material of the etch stop material layer 4 and selective to the encapsulation layer (such as a silicon oxide layer) with a selectivity greater than 100 and preferably greater than 1,000.

In one embodiment, the planar sacrificial spacer layer 5 includes a semiconductor material such as silicon, a silicon-germanium alloy, or a doped derivative therefrom. In one embodiment, the planar sacrificial spacer layer 5 may comprise silicon at an atomic percentage greater than 50%. In one embodiment, the planar sacrificial spacer layer 5 may comprise amorphous silicon, polysilicon, an amorphous silicon-germanium alloy, or a polycrystalline silicon-germanium alloy. The atomic percentage of silicon in the planar sacrificial spacer layer 5 may be in range from 50% to 100%, such as from 80% to 99%, and/or from 90% to 98%. In one embodiment, the atomic percentage of germanium in the planar sacrificial spacer layer 5 may be in a range from 0% to 50%, and/or from 0% to 30%.

In one embodiment, the planar sacrificial spacer layer 5 may be formed by an anisotropic deposition process that deposits a silicon-containing material on the top surface of the etch stop material layer 4 and does not deposit the silicon-containing material on a backside surface 3 of the first substrate 108. For example, plasma-enhanced chemical vapor deposition (PECVD) process may be employed to deposit the planar sacrificial spacer layer 5. The planar sacrificial spacer layer 5 is a planar layer having a uniform thickness between a horizontal top surface and a horizontal bottom surface. The thickness of the planar sacrificial spacer layer 5 may be in a range from 200 nm to 4,000 nm, such as from 400 nm to 2,000 nm, although lesser and greater thicknesses may also be employed.

Referring to FIG. 3, a first insulating encapsulation layer 6 can be formed around the assembly of the first substrate 108, the etch stop material layer 4, and the planar sacrificial spacer layer 5. In one embodiment, the first encapsulation layer 6 comprises an insulating material, such as silicon oxide, different from the material of the etch stop material layer 4 and the planar sacrificial spacer layer 5. Other insulating materials (e.g., silicon oxynitride, metal oxide, etc.) may alternatively be used. According to an aspect of the present disclosure, the first silicon oxide encapsulation layer 6 can be formed as a single continuous material layer that encapsulates the first substrate 108, the etch stop material layer 4, and the planar sacrificial spacer layer 5. In other words, the combination of the first substrate 108, the etch stop material layer 4, and the planar sacrificial spacer layer 5 does not include any surface that is physically exposed to the ambient after formation of the first silicon oxide encapsulation layer 6. The first silicon oxide encapsulation layer 6 can be formed over the planar sacrificial spacer layer 5, on a backside surface 3 and a side surface of the first substrate 108, and on side surfaces of the etch stop material layer 4 and the planar sacrificial spacer layer 5.

In one embodiment, the first silicon oxide encapsulation layer 6 may be formed by conformal deposition of a silicon oxide material employing at least one chemical vapor deposition process. For example, at least one low pressure chemical vapor deposition that employs tetraethylorthosilicate (TEOS) as a precursor material may be employed to form the first silicon-oxide encapsulation layer 6. In one embodiment, a first chemical vapor deposition process may be performed with the top side of the first substrate 108 oriented upward, and a second chemical vapor deposition process may be performed with the bottom side of the first substrate 108 oriented upward. Alternatively, a chemical vapor deposition process that deposits a silicon oxide material (such as undoped silicate glass) with sufficient conformity may be performed with a change in the location and/or orientations of support locations (such as rails in a furnace or pins in a single wafer deposition process) to ensure that the entirety of surfaces of the exemplary structure as provided at the processing steps of FIG. 2 is covered with the first silicon oxide encapsulation layer 6.

In another embodiment, the first silicon oxide encapsulation layer 6 can be formed by thermal or plasma oxidation of surface portions of the first substrate 108 and the planar sacrificial spacer layer 5. In one embodiment, a thickness of the first silicon oxide encapsulation layer 6 is greater than one half of a thickness of the etch stop material layer 4. In this case, the first silicon oxide encapsulation layer 6 can be formed by oxidation of the surface of a silicon-containing material (such as single crystalline silicon) of the first substrate 108 and by oxidation of surface portions of the silicon-containing material (such as amorphous silicon or polysilicon or a silicon-germanium alloy) of the planar sacrificial spacer layer 5. By selecting the thickness of the first silicon oxide encapsulation layer 6 to be greater than one half of the thickness of the etch stop material layer 4, peripheral regions of a portion of the first silicon oxide encapsulation layer 6 that is derived from the surface portions of the planar sacrificial spacer layer 5 and peripheral regions of a portion of the first silicon oxide encapsulation layer that is derived from the surface portions of the first substrate 108 merge over a sidewall of the etch stop material layer 4. The etch stop material layer 4 can be laterally sealed as the two thermally-oxidized silicon oxide portions merge to form the first silicon oxide encapsulation layer 6 as a single continuous structure without any opening therethrough.

The thickness of the first silicon oxide encapsulation layer 6, as measured over a horizontal top surface of the remaining portion of the planar sacrificial spacer layer 5, may be in a range from 200 nm to 4,000 nm, such as from 400 nm to 2,000 nm, although lesser and greater thicknesses may also be employed. The thickness of the planar sacrificial spacer layer 5 may be in a range from 200 nm to 4,000 nm, such as from 400 nm to 2,000 nm, although lesser and greater thicknesses may also be employed.

Figure 4B:
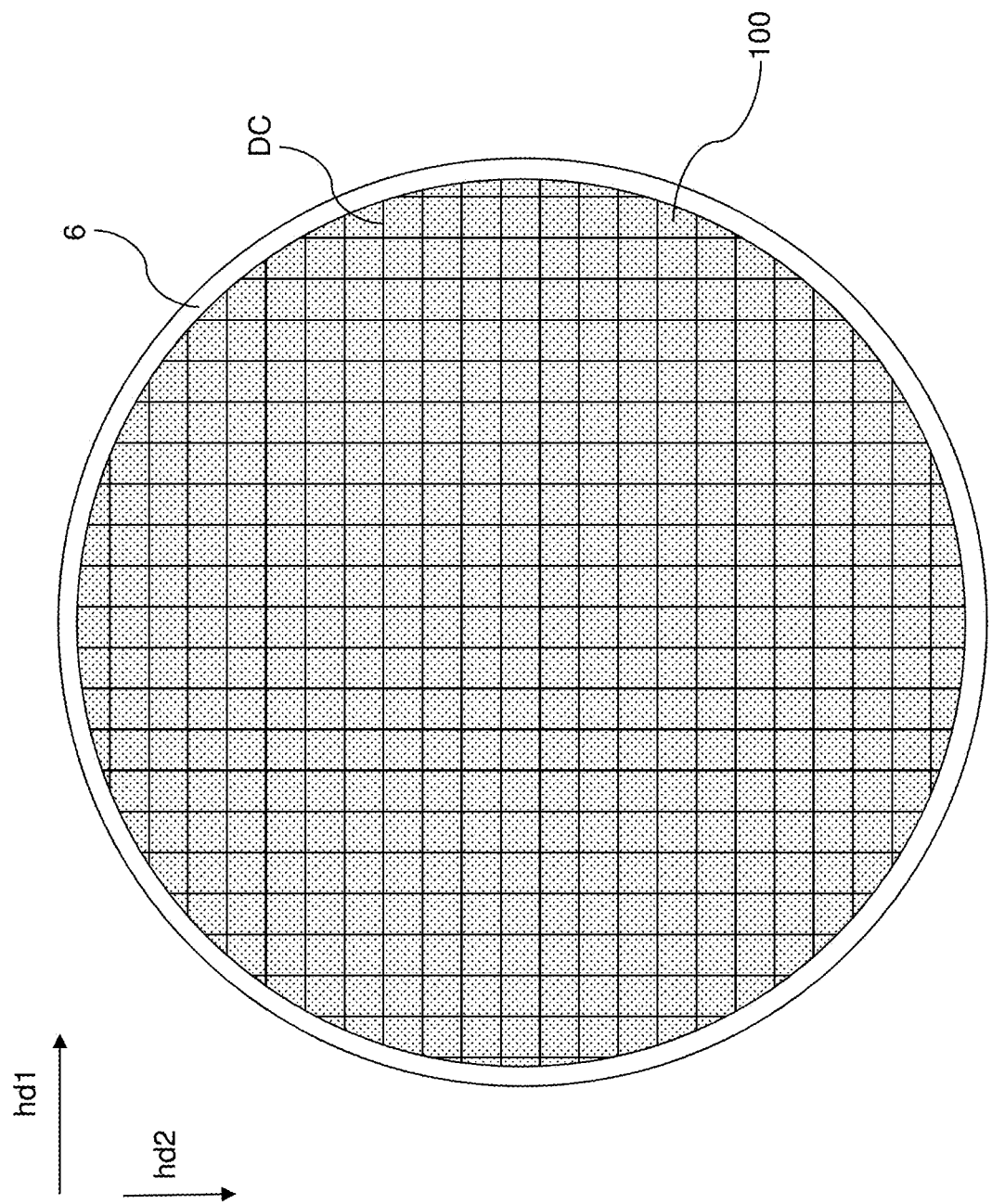
FIG. 4B is a top-down view of the first substrate of FIG. 4A.

Referring to FIGS. 4A and 4B, various processing steps can be performed to form semiconductor devices over the top surface of the first silicon oxide encapsulation layer 6 that overlies the front surface of the first substrate 108. The various processing steps may comprise deposition steps, patterning steps, etch steps, and/or planarization steps. The various semiconductor devices may comprise any semiconductor device as known in the at that may be manufactured over a planar silicon oxide surface. In some embodiments, a layer transfer process may be employed to bond a single crystalline semiconductor material layer to the top surface of the first silicon oxide encapsulation layer. In other embodiment, one or more polycrystalline or amorphous semiconductor layers (e.g., polysilicon or amorphous silicon layer) is deposited over the first silicon oxide encapsulation layer 6. In one embodiment, the various semiconductor devices may comprise three-dimensional memory devices that include a respective set of memory stack structures vertically extending through an alternating stack of insulation layers and electrically conductive layers, as will be described in more detail below with respect to FIG. 11.

Generally, a continuous structure 100L including semiconductor devices therein can be formed over the top surface of the first silicon oxide encapsulation layer 6. In one embodiment, the continuous structure 100L can include a two-dimensional array of first semiconductor dies 100. The first semiconductor dies 100 may be repeated along two different horizontal directions (such as a first horizontal direction hd1 and a second horizontal direction hd2) with a respective periodicity. In one embodiment, the first semiconductor dies 100 may be arranged as a rectangular periodic array of first semiconductor dies 100. In this case, the second horizontal direction hd2 can be perpendicular to the first horizontal direction hd1. Spaces between neighboring pairs of first semiconductor dies 100 may be designed as non-chip areas, or kerf areas, which correspond to dicing channels "DC" to be subsequently employed to singulate the first semiconductor dies 100. A subset of the first semiconductor dies 100 located at the periphery of the continuous structure 100L may include less than the entire area of a fully functional semiconductor die 100 due to edge exclusion during formation of the semiconductor dies 100, and are herein referred to as partial first semiconductor dies. At this processing step, the first semiconductor dies 100 are adjoined to each other by portions of the continuous structure 100L that are located in the dicing channels DC. In one embodiment, the dicing channels DC may have a checkerboard pattern.

In one embodiment, the continuous structure 100L may comprise metal interconnect structures that are embedded in dielectric material layers and overlie the semiconductor devices. The metal interconnect structures may comprise metal line structures and metal via structures. According to an aspect of the present disclosure, a topmost region of the continuous structure 100L may comprise first metal bonding pads (shown in FIG. 11) that are configured for metal-to-metal bonding (such as copper-to-copper bonding). In this case, each first semiconductor die 100 may comprise a respective set of first metal bonding pads that are configured for metal-to-metal bonding, and are physically exposed to the ambient at the top surface of the continuous structure 100L.

Referring to FIG. 5, an optional first protective annular spacer 107 may be formed. The optional protective annular spacer 107 may be employed to protect any silicon-containing element that may be physically exposed to the ambient at the sidewall of the continuous structure 100L during a subsequent isotropic etch process that etches the semiconductor material of the planar sacrificial spacer layer 5. In this case, a protective material may be conformally deposited over the continuous structure 100L, and can be anisotropically etched to remove horizontally-extending portions. A remaining vertically-extending portion of the protective material comprises the first protective annular spacer 107. Generally, the first protective annular spacer 107 may comprise any material that has a lower etch rate in the etch chemistry of the isotropic etch process to be subsequently employed to etch the planar sacrificial spacer layer 5, i.e., any material that is not etched significantly during the subsequent isotropic etch process. In one embodiment, the first protective annular spacer 107 may comprise silicon oxide.

In one embodiment, the duration of the anisotropic etch can be selected such that an upper portion of the sidewall of the continuous structure 100L is not covered by the first protective annular spacer 107. Thus, if employed, the first protective annular spacer 107 can be formed on a lower region of a sidewall of the continuous structure 100L.

Figure 6B:
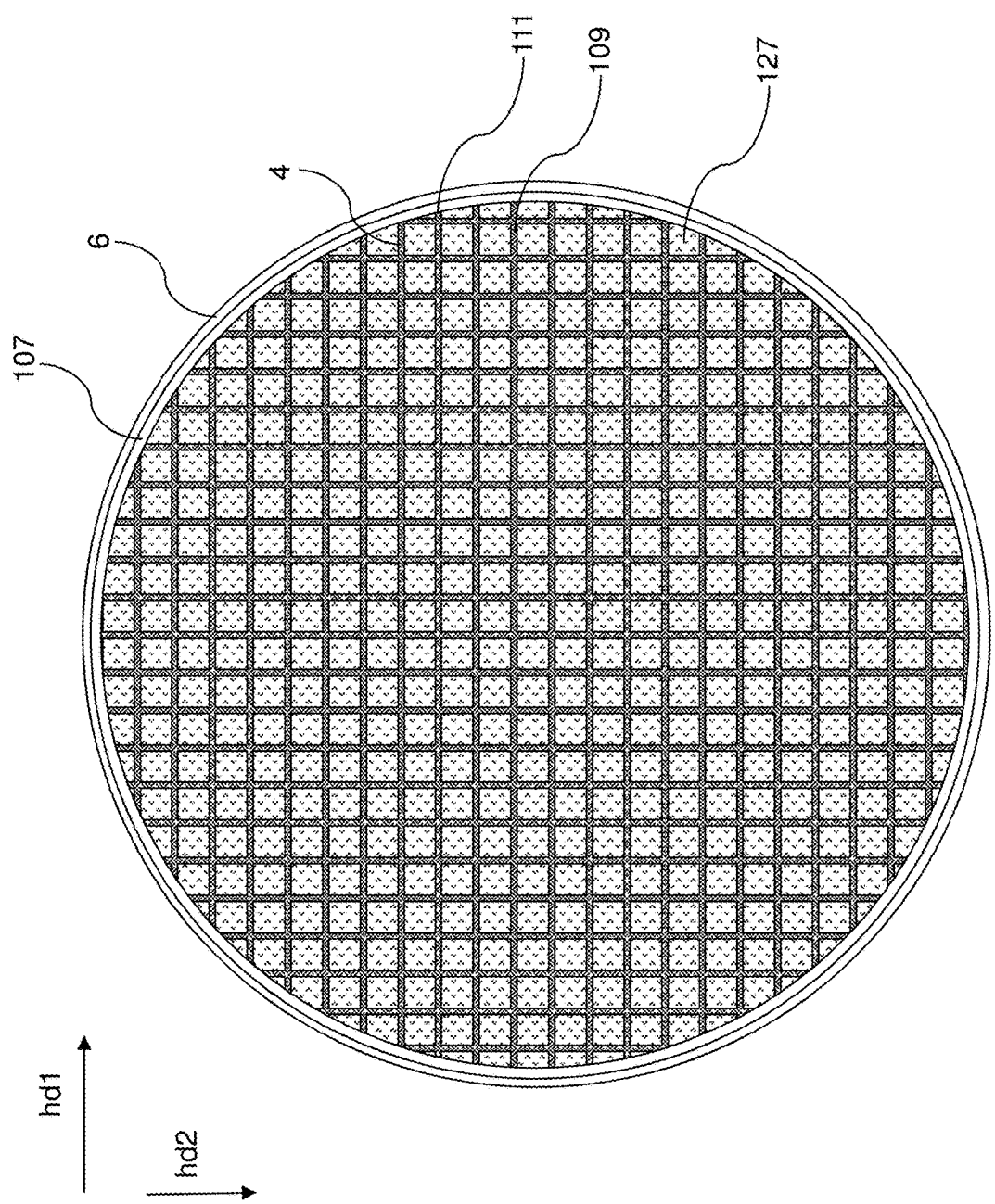
FIG. 6B is a top-down view of the first substrate of FIG. 6A.

Referring to FIGS. 6A and 6B, a photoresist layer 127 can be applied over the continuous structure 100L, for example, by spin coating and drying. The photoresist layer 127 can be patterned into a two-dimensional array of discrete photoresist material portions, for example, by lithographic exposure and development. Specifically, the photoresist layer 127 can be patterned such that patterned portions of the photoresist layer 127 cover an entirety of each first semiconductor die 100 within the two-dimensional array of first semiconductor dies 100, and do not cover areas DC between neighboring pairs of first semiconductor dies 100 within the two-dimensional array of first semiconductor dies 100. Thus, the kerf regions between each neighboring pair of first semiconductor dies 100 are not covered by the patterned portions of the photoresist layer 127. The pattern of areas that are not covered by the photoresist layer 127 may be a checkerboard pattern including first strips of unmasked surfaces of the continuous structure 100L that laterally extend along the first horizontal direction hd1, and second strips of unmasked surfaces of the continuous structure 100L that laterally extend along the second horizontal direction hd2. The width of each strip of unmasked surfaces of the continuous structure 100L may be in a range from 200 microns to 3 mm, such as from 400 microns to 1.5 mm, although lesser and greater widths may also be employed.

An anisotropic etch process can be performed to etch through various materials in the unmasked regions of the continuous structure 100L employing the patterned portions of the photoresist layer 127 as an etch mask. The anisotropic etch process comprises a reactive ion etch process having an etch chemistry that etches materials within the continuous structure 100L. In one embodiment, the anisotropic etch process may comprise a series of anisotropic etch steps having a respective etch chemistry that is optimized for etching a respective target material within the continuous structure 100L. According to an aspect of the present disclosure, the anisotropic etch process may comprise a terminal etch step that etches the material of the first silicon oxide encapsulation layer 6 and/or the material of the planar sacrificial spacer layer 5 selective to the material of the etch stop material layer 4. In an illustrative example, if the etch stop material layer 4 includes silicon nitride or a dielectric metal oxide, the terminal etch step of the anisotropic etch process may etch through the material of the first silicon oxide encapsulation layer 6 and/or the material of the planar sacrificial spacer layer 5 selective to silicon nitride or selective to the dielectric metal oxide, such that the etch stop material layer 4 acts as an etch stop.

Interconnected cavities that are formed through the continuous structure 100L by the anisotropic etch process forms a combination of first laterally-extending trenches that laterally extend along the first horizontal direction hd1 and second laterally-extending trenches that laterally extend along the second horizontal direction hd2. The laterally-extending trenches are formed between neighboring pairs of first semiconductor dies 100, and are herein referred to as inter-die trenches 109, i.e., trenches that are formed between neighboring pairs of semiconductor dies. The inter-die trenches 109 divide the continuous structure 100L into a two-dimensional array of first semiconductor dies 100. Upon formation of the inter-die trenches 109, the first semiconductor dies 100 are laterally spaced apart from each other by the inter-die trenches 109. Thus, the inter-die trenches 109 are formed after the formation of the layers of the semiconductor dies 100.

The inter-die trenches 109 vertically extend from the horizontal plane including the top surface of the first semiconductor dies 100 to at least to the horizontal plane including the top surface of the planar sacrificial spacer layer 5. The bottom surfaces of the inter-tier trenches 109 may be formed between the horizontal plane including the top surface of the planar sacrificial spacer layer 5 and the horizontal plane including the bottom surface of the etch stop material layer 4. For example, the inter-die trenches 109 may extend to or into top surface of the etch stop material layer 4. The inter-die trenches 109 are connected to peripheral slit-shaped openings 111 that are formed at least within an upper region of remaining portions of the sidewall of the continuous structure 100L as provided at the processing steps of FIG. 5. In case the protective annular spacer 107 is present, the slit-shaped openings 111 are located above the top surface of the protective annular spacer 107. In case the protective annular spacer 107 is not employed, the slit-shaped openings 111 may vertically extend from the horizontal plane including the top surfaces of the first semiconductor dies 100 at least down to the horizontal plane including the top surface of the first silicon oxide encapsulation layer 6. Subsequently, the photoresist layer 127 may be removed, for example, by ashing.

Referring to FIG. 7, a second substrate 208 is illustrated after formation of a second insulating encapsulation layer 206 thereupon. The second insulating encapsulation layer 206 may comprise a silicon oxide layer or another suitable insulating layer. The second substrate 208 can be a semiconductor substrate, such as a commercially available silicon wafer having a maximum lateral dimension in a range from 100 mm to 450 mm, and having a thickness in a range from 300 microns to 2 mm, although lesser and greater diameters and/or thicknesses can also be employed. In one embodiment, the second substrate 208 can consist essentially of a semiconductor material, such as single crystalline silicon, polysilicon, silicon carbide, a III-V compound semiconductor material such as GaN or AlGaN, a II-VI compound semiconductor material, or an organic semiconductor material. Alternatively, the second substrate 208 may comprise an insulating substrate, such as a ceramic, quartz or glass substrate. Yet alternatively, the second substrate 208 may be a semiconductor-on-insulator (SOI) substrate. In one embodiment, the second substrate 208 may have a horizontal cross-sectional shape of a circle, a rectangle, or any closed two-dimensional curvilinear shape. In one embodiment, the second substrate 208 may be a commercially available single crystalline substrate having a circular or a quasi-circular horizontal cross-sectional shape, such as a 300 mm single crystalline silicon substrate or a 450 mm single crystalline silicon wafer. The wafer may have one or more optional wafer flats (not shown for clarity), such that the wafer has a quasi-circular (i.e., circle with one or more flat sides) horizontal cross-sectional shape due to the presence of the wafer flat(s).

The second silicon oxide encapsulation layer 106 can be formed around the second substrate 208. According to an aspect of the present disclosure, the second silicon oxide encapsulation layer 206 can be formed as a single continuous material layer that encapsulates the second substrate 208. In other words, the second substrate 208 does not include any surface that is physically exposed to the ambient after formation of the second silicon oxide encapsulation layer 206.

In one embodiment, the second silicon oxide encapsulation layer 206 may be formed by conformal deposition of a silicon oxide material employing at least one chemical vapor deposition process. For example, at least one low pressure chemical vapor deposition that employs tetraethylorthosilicate (TEOS) as a precursor material may be employed to form the first silicon-oxide encapsulation layer 106. In one embodiment, a first chemical vapor deposition process may be performed with the top side of the second substrate 208 oriented upward, and a second chemical vapor deposition process may be performed with the bottom side of the second substrate 208 oriented upward. Alternatively, a chemical vapor deposition process that deposits a silicon oxide material (such as undoped silicate glass) with sufficient conformity may be performed with a change in the location and/or orientations of support locations (such as rails in a furnace or pins in a single wafer deposition process) to ensure that the entirety of surfaces of the exemplary structure as provided at the processing steps of FIG. 2 is covered with the second silicon oxide encapsulation layer 206.

In another embodiment, the second silicon oxide encapsulation layer 206 can be formed by thermal or plasma oxidation of surface portions of the second substrate 208. The thickness of the second silicon oxide encapsulation layer 206 may be in a range from 200 nm to 4,000 nm, such as from 400 nm to 2,000 nm, although lesser and greater thicknesses may also be employed. Generally, the second silicon oxide encapsulation layer 206 may be formed as a single continuous material layer that encapsulates the second substrate 208.

Referring to FIG. 8, a horizontally-extending portion of the second silicon oxide encapsulation layer 206 can be removed from a front surface of the second substrate 208 to physically expose a horizontal semiconductor top surface of the second substrate 208. For example, a masking material layer (not shown) such as a photoresist material layer can be formed on the backside surface and the side surfaces of the second substrate 208 without masking the horizontally-extending portion of the second silicon oxide encapsulation layer 206 that overlies the front side surface of the second substrate 208. An etch process, such as a wet etch process, that etches the material of the second silicon oxide encapsulation layer 206 selective to the semiconductor material of the second substrate 208 may be performed to remove the horizontally-extending portion of the second silicon oxide encapsulation layer 206 that overlie the front surface of the second substrate 208. In an illustrative example, the etch process may comprise a wet etch process employing dilute hydrofluoric acid.

A device layer 200L including an array of second semiconductor dies can be formed on the front surface of the second substrate 208. The device layer 200L may comprise an array of second semiconductor dies. According to an aspect of the present disclosure, the second semiconductor dies may be formed with the same periodicity as the first semiconductor dies 100 provided on the first substrate 108. Further, the second semiconductor dies may be configured to be bonded to a respective one of the first semiconductor dies 100 to provide a functionality that complements the functions of the respective one of the first semiconductor dies 100. For example, the first semiconductor dies 100 may comprise memory dies including a three-dimensional array of memory elements (such as three-dimensional NAND memory dies), and the second semiconductor dies may comprise logic dies (e.g., dies containing driver circuitry for the memory dies) configured to control the operation of the memory dies. For example, the driver circuitry may comprise field effect transistors (e.g., field effect transistors in a CMOS configuration) with single crystal silicon channels formed in the single crystal silicon second substrate 208 and/or in a single crystal silicon layer which grown epitaxially on the single crystal silicon second substrate 208. Generally, each of the second semiconductor dies may comprise an array of second bonding pads that is configured to be bonded with an array of first bonding pads in one of the first semiconductor dies 100.

In one embodiment, the device layer 200L may comprise metal interconnect structures that are embedded in dielectric material layers and overlie the semiconductor devices. The metal interconnect structures may comprise metal line structures and metal via structures. According to an aspect of the present disclosure, a topmost region of the device layer 200L may comprise second metal bonding pads (not expressly shown) that are configured for metal-to-metal bonding (such as copper-to-copper bonding). In this case, each second semiconductor die 200 may comprise a respective set of second metal bonding pads that are configured for metal-to-metal bonding, and are physically exposed to the ambient at the top surface of the device layer 200L.

Figure 9A:
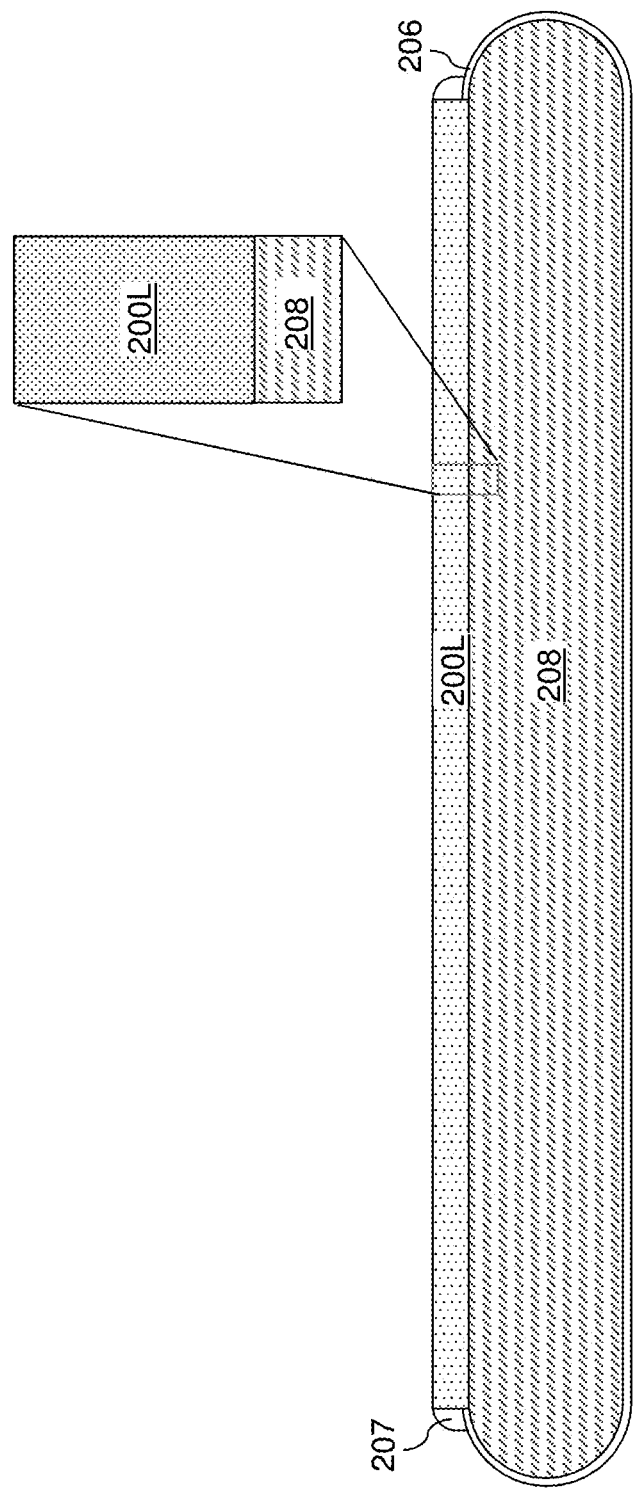
FIG. 9A is a schematic vertical cross-sectional view of the second substrate after formation of an optional second protective annular spacer according to an embodiment of the present disclosure.
Figure 9B:
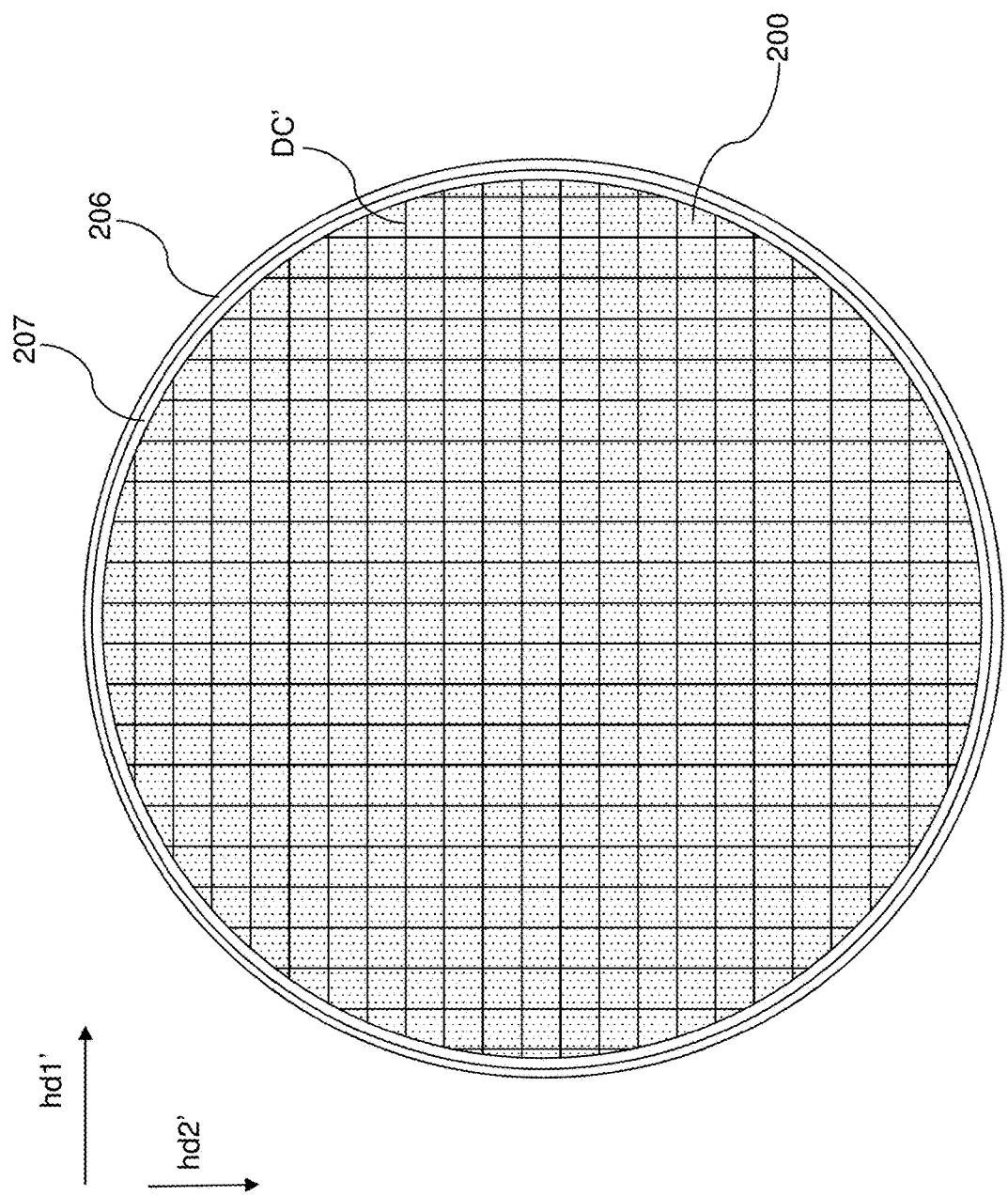
FIG. 9B is a top-down view of the second substrate of FIG. 9A.

Referring to FIGS. 9A and 9B, an optional second protective annular spacer 207 may be formed. The optional protective annular spacer 207 may be employed to protect any silicon-containing element that may be physically exposed to the ambient at the sidewall of the device layer 200L during a subsequent isotropic etch process that etches the semiconductor material of the planar sacrificial spacer layer 5. In this case, a protective material may be conformally deposited over the device layer 200L, and can be anisotropically etched to remove horizontally-extending portions. A remaining vertically-extending portion of the protective material comprises the second protective annular spacer 207. Generally, the second protective annular spacer 207 may comprise any material that has a lower etch rate in the etch chemistry of the isotropic etch process to be subsequently employed to etch the planar sacrificial spacer layer 5, i.e., any material that is not etched significantly during the subsequent isotropic etch process. In one embodiment, the second protective annular spacer 207 may comprise silicon oxide.

The device layer 200L can include a two-dimensional array of second semiconductor dies 200. The second semiconductor dies 200 may be repeated along two different horizontal directions (such as a first horizontal direction hd1' and a second horizontal direction hd2') with a respective periodicity. The periodicity of the second semiconductor dies 200 along the first horizontal direction hd1' illustrated in FIG. 9B may be the same as the periodicity of the first semiconductor dies 100 along the first horizontal direction hd1 illustrated in FIG. 4B. The periodicity of the second semiconductor dies 200 along the second horizontal direction hd2' illustrated in FIG. 9B may be the same as the periodicity of the first semiconductor dies 100 along the second horizontal direction hd2 illustrated in FIG. 4B. In one embodiment, the second semiconductor dies 200 may be arranged as a rectangular periodic array of second semiconductor dies 200. Spaces between neighboring pairs of second semiconductor dies 200 may be designed as non-chip areas, or kerf areas, which correspond to dicing channels (DC') to be subsequently employed to singulate the second semiconductor dies 200. A subset of the second semiconductor dies 200 located at the periphery of the device layer 200L may include less than the entire area of a fully functional semiconductor die 200 due to edge exclusion during formation of the semiconductor dies 200, and are herein referred to as partial second semiconductor dies. The second semiconductor dies 200 are adjoined to each other by portions of the device layer 200L that are located in the dicing channels DC'. In one embodiment, the dicing channels DC' may have a checkerboard pattern.

Figure 10:
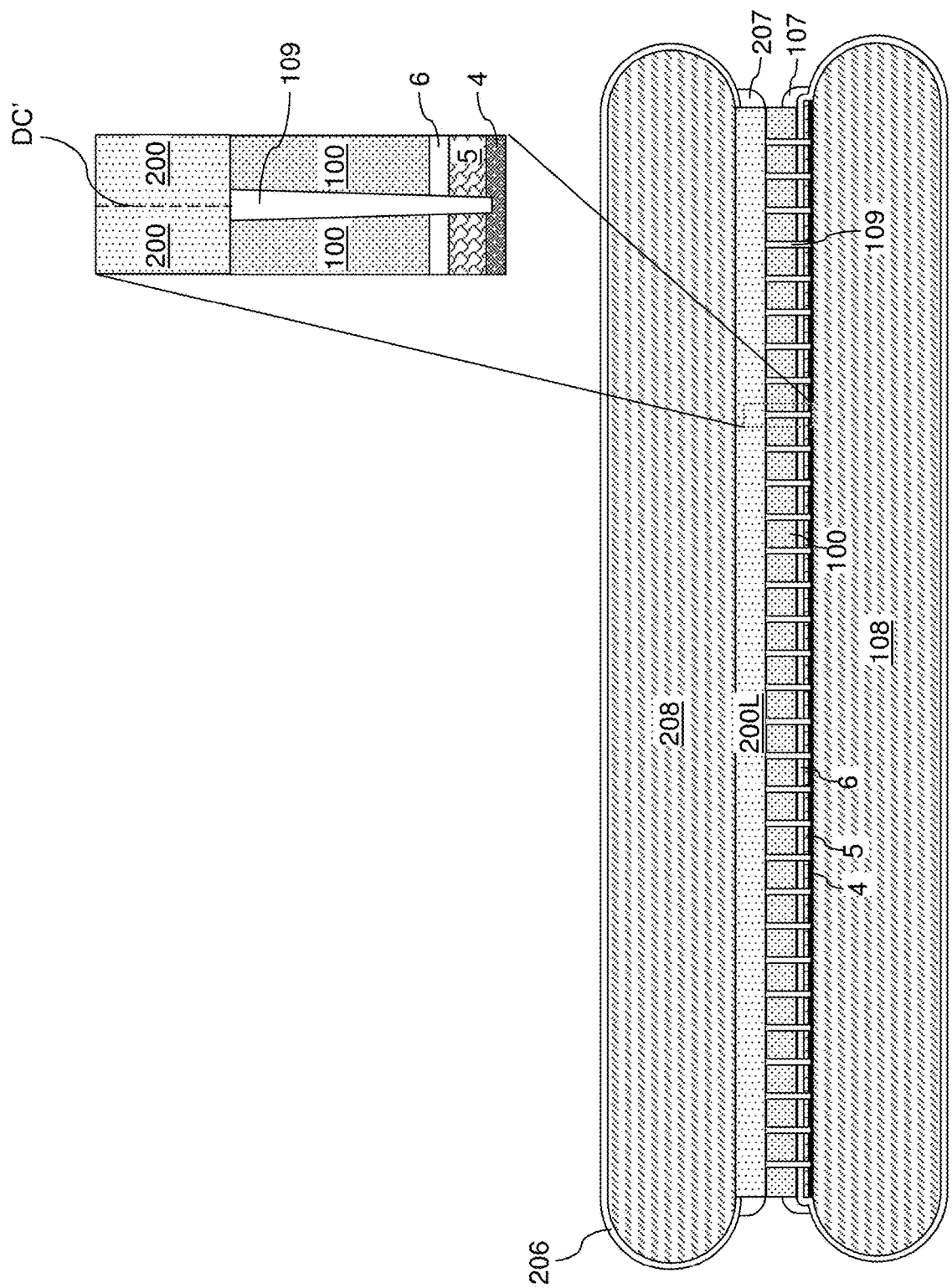
FIG. 10 is a vertical cross-sectional view of an exemplary structure including a bonded assembly of the first substrate and the second substrate according to an embodiment of the present disclosure.

Referring to FIG. 10, the first substrate 108 and the second substrate 208 can be aligned for bonding. Specifically, the first substrate 108 and the second substrate 208 can be aligned such that each mating pair of a respective first bonding pad in a first semiconductor dies 100 and a respective second bonding pad in a second semiconductor dies 200 face each other, and are bought into contact with each other. Metal-to-metal bonding (such as copper-to-copper bonding) can be induced between each mating pair of a respective first bonding pad in a first semiconductor dies 100 and a respective second bonding pad in a second semiconductor dies 200 by performing a thermal anneal process at an elevated temperature while the first substrate 108 and the second substrate 208 are pushed against each other. In some embodiments, dielectric-to-dielectric bonding may occur concurrently with the metal-to-metal bonding between a first bonding-level dielectric layer within each first semiconductor die 100 and a second bonding-level dielectric layer within a respective one of the second semiconductor dies 200.

Generally, the two-dimensional array of first semiconductor dies 100 located on the first substrate 108 can be bonded to an array of second semiconductor dies 200 located on the second substrate 208. The inter-die trenches 109 overlap with the kerf regions DC' between neighboring pairs of second semiconductor dies 200 in a plan view, i.e., a view along a vertical direction in which the layout of all components are shown. The inter-die trenches 109 may comprise first inter-die trenches 109 that laterally extend along the first horizontal direction hd1 and second inter-die trenches 109 that laterally extend along the second horizontal direction hd2. The inter-die trenches 109 are connected to the ambient through the above described peripheral slit-shaped openings 111 between neighboring pairs of partial first semiconductor dies that are located at the peripheral region overlying the first substrate 108. In one embodiment, the sidewalls of the inter-die trenches 109 may have a taper angle (as measured from the vertical direction) so that the each neighboring pair of first semiconductor dies 100 that are laterally spaced by a respective inter-die trench 109 has a greater lateral spacing within the horizontal plane including the bonding interfaces between the first semiconductor dies 100 and the second semiconductor dies 200 than within the horizontal plane including the interfaces between the first semiconductor dies 100 and the first silicon oxide encapsulation layer 6. In one embodiment, the width of the inter-die trenches 109 may be in a range from 200 microns to 3 mm, such as from 400 microns to 1.5 mm, although lesser and greater widths may also be employed.

Figure 11:
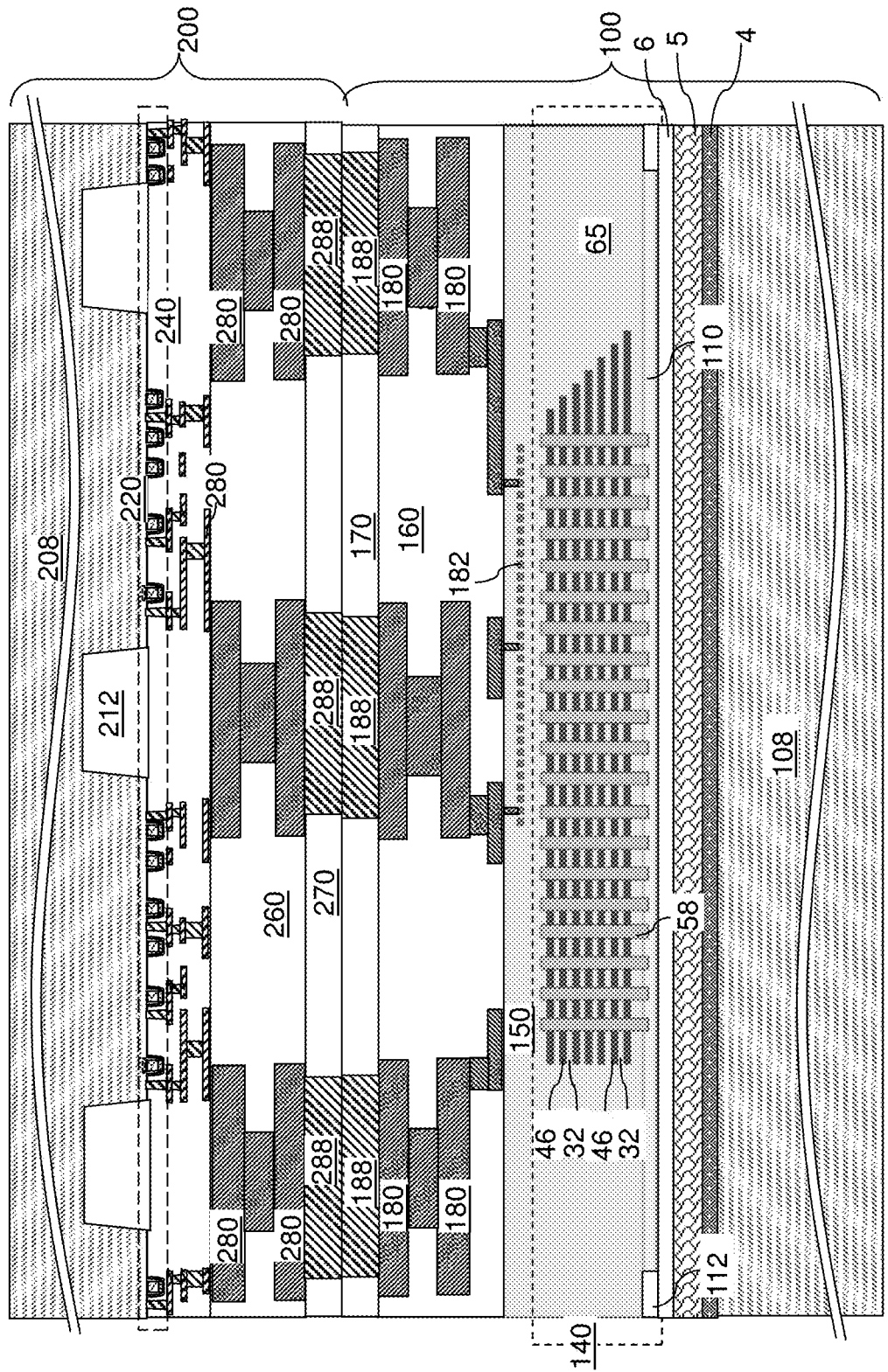
FIG. 11 is a vertical cross-sectional view of a portion of the exemplary structure of FIG. 10.

Referring to FIG. 11, an example of semiconductor devices that may be present in a bonded assembly of a first semiconductor die 100 and a second semiconductor die 200 within the exemplary structure of FIG. 10 is illustrated. The example illustrated in FIG. 11 is only for illustrative purposed, and does not limit the type of semiconductor devices that may be formed in the first semiconductor die 100 and/or in the second semiconductor die 200 in any manner.

In the illustrated example, the first semiconductor die 100 may comprise a memory die that is provided on the top surface of a horizontally-extending portion of the first silicon oxide encapsulation layer 6. The memory die may comprise a memory device 140. The memory device 140 may comprise, for example, an optional horizontal semiconductor layer 110 including a doped semiconductor material, and optional channel isolation dielectric structures 112 including a dielectric material, such as silicon oxide, disposed between the horizontal semiconductor layer 110 and the inter-die trenches 109. The channel isolation dielectric structures 112 protect the horizontal semiconductor layer 110 during a subsequent isotropic etch process that is performed to remove the sacrificial planar spacer layer 5. The memory device 140 may further comprise a three-dimensional memory array, such as a three-dimensional NAND memory array. For example, the memory die may include a vertically alternating stack of insulating layers 32 and electrically conductive layers 46, and a two-dimensional array of memory openings vertically extending through the vertically alternating stack (32, 46). The electrically conductive layers 46 may comprise word lines and select gate electrodes of the three-dimensional NAND memory device.

A memory opening fill structure 58 may be provided within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc.

The electrically conductive layers 46 may be patterned to provide a terrace region in which each overlying electrically conductive layer 46 has a lesser lateral extent than any underlying electrically conductive layer 46. Contact via structures (not shown) may be provided on the electrically conductive layers 46 in the terrace region to provide electrical connection to the electrically conductive layers 46.

Dielectric material portions 65 may be provided around each vertically alternating stack (32, 46) to provide electrical isolation between neighboring vertically alternating stacks (32, 46). Memory-side dielectric material layers (150, 160) may be provided over the memory device 140. The memory-side dielectric material layers (150, 160) may include memory-side proximal dielectric material layers 150 that embed contact via structures and bit lines 182 and memory-side distal dielectric material layers 160 that embed a subset of the memory-side metal interconnect structures 180 located above the memory-side proximal dielectric material layers 150. As used herein, a "proximal" surface refers to a surface that is close to a substrate, and a "distal" surface refers to a surface that is distal from the substrate.

The bit lines 182 may electrically contact drain regions located above the vertical semiconductor channel at the top of the memory opening fill structures 58. The contact via structures contact various nodes (e.g., the electrically conductive layers 46, etc.) of the memory-side semiconductor devices. Generally, the memory-side metal interconnect structures 180 and the bit lines 182 can be electrically connected to the memory-side semiconductor devices 140.

Each of the memory-side proximal dielectric material layers 150 and the memory-side distal dielectric material layers 160 may include a dielectric material, such as undoped silicate glass, a doped silicate glass, organosilicate glass, silicon nitride, a dielectric metal oxide, or a combination thereof. For example, the memory-side distal dielectric material layers 160 may include one or more dielectric diffusion barrier layers (not expressly shown). In this case, each dielectric diffusion barrier layer embedded in the memory-side distal dielectric material layers 160 may include silicon carbon nitride (i.e., silicon carbonitride "SiCN", which is also referred to silicon carbide nitride), silicon nitride ($Si_3N_4$), silicon oxynitride, or any other dielectric material that is effective in blocking diffusion of copper. In one embodiment, each dielectric diffusion barrier layer embedded in the memory-side distal dielectric material layers 160 may include a dielectric material having a dielectric constant less than 5, such as SiCN having a dielectric constant of about 3.8, to reduce RC delay of the memory-side metal interconnect structures 160. Each dielectric diffusion barrier layer may have a thickness in a range from 10 nm to 30 nm.

A memory-side bonding-level dielectric layer 170 can be provided over the memory-side distal dielectric material layers 160. The memory-side bonding-level dielectric layer 170 may include a dielectric material that permits dielectric-to-dielectric bonding. The memory-side bonding-level dielectric layer 170 may include, and/or consist essentially of, undoped silicate glass (i.e. silicon oxide), a doped silicate glass, organosilicate glass, silicon nitride, or a dielectric metal oxide. The thickness of the memory-side bonding-level dielectric layer 170 may be in a range from 300 nm to 3,000 nm, although lesser and greater thicknesses may also be employed. The memory-side bonding-level dielectric layer 170 may have a planar top surface. First bonding pads 188 configured for metal-to-metal bonding can be provided within the memory-side bonding-level dielectric layer 170.

The logic die 200 includes the second substrate 208, logic-side semiconductor devices 240 located on the logic-side substrate 208, logic-side dielectric material layers 260 located on the logic-side semiconductor devices 240, and logic-side metal interconnect structures 280 embedded in the logic-side dielectric material layers 260. Shallow trench isolation structures 212 may be provided in an upper portion of the second substrate 208 to provide electrical isolation among groups of the logic-side semiconductor devices 240.

Generally, the logic-side semiconductor devices 240 may comprise any semiconductor device, such as field effect transistors, that may be operated in conjunction with the memory device 140 to provide enhanced functionality. In one embodiment, the logic die 200 comprises a support circuitry (i.e., a driver/peripheral circuitry) for operation of memory device 400. In one embodiment, the memory device 140 may include a three-dimensional memory device including a three-dimensional array of memory elements, word lines (that may comprise a subset of the electrically conductive layers 46), and bit lines 182, and the logic-side semiconductor devices 240 of the logic die 200 may include a peripheral circuitry for operation of the three-dimensional array of memory elements. The peripheral circuitry may include one or more word line driver circuits that drive the word lines of the three-dimensional array of memory elements of the memory die, one or more bit line driver circuits that drive the bit lines 182 of the memory die, one or more word line decoder circuits that decode the addresses for the word lines, one or more bit line decoder circuits that decode the addresses for the bit lines 182, one or more sense amplifier circuits that sense the states of memory elements within the memory opening fill structures 58 of the memory die, a source power supply circuit that provides power to the horizontal semiconductor layer 110 in the memory die, a data buffer and/or latch, and/or any other semiconductor circuit that may be used to operate the three-dimensional memory device of the memory die.

Each of the logic-side dielectric material layers 260 may include a dielectric material such as undoped silicate glass, a doped silicate glass, organosilicate glass, silicon nitride, a dielectric metal oxide, or a combination thereof. A logic-side bonding-level dielectric layer 270 can be provided over the logic-side distal dielectric material layers 260. The logic-side bonding-level dielectric layer 270 may include a dielectric material that permits dielectric-to-dielectric bonding. The logic-side bonding-level dielectric layer 270 may include, and/or consist essentially of, undoped silicate glass, a doped silicate glass, organosilicate glass, silicon nitride, or a dielectric metal oxide. The thickness of the logic-side bonding-level dielectric layer 270 may be in a range from 300 nm to 3,000 nm, although lesser and greater thicknesses may also be employed. The logic-side bonding-level dielectric layer 270 may have a planar top surface. second bonding pads 288 configured for metal-to-metal bonding can be provided within the logic-side bonding-level dielectric layer 270.

Figure 12:
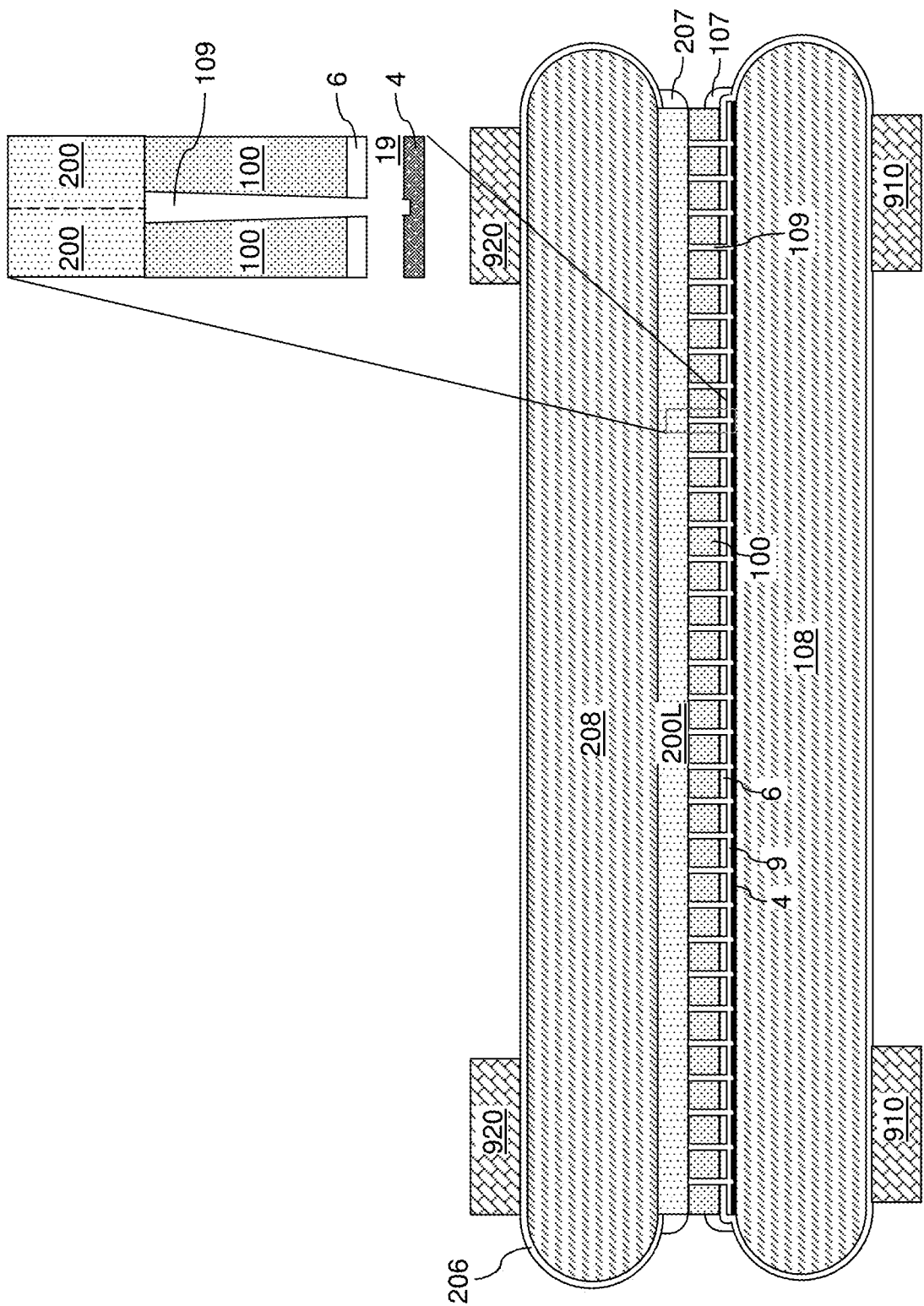
FIG. 12 is a vertical cross-sectional view of the exemplary structure after removal of the planar sacrificial spacer layer in a wet etch tank according to an embodiment of the present disclosure.

Referring to FIG. 12, the exemplary structure illustrated in FIG. 10 can be disposed in an apparatus configured to perform an isotropic selective etch process that removes the material of the planar sacrificial spacer layer 5 selective to the materials of the etch stop material layer 4, the material of the first silicon oxide encapsulation layer 6, the material of the second silicon oxide encapsulation layer 206, the various materials of portions of the first semiconductor die 100 that are physically exposed to the inter-die trenches 109, the material of the first protective annular spacer 107 (if present), and the material of the second protective annular spacer 207 (if present). Generally, the planar sacrificial spacer layer 5 can be removed selective to the materials of the etch stop material layer 4, the first silicon oxide encapsulation layer 6, the second silicon oxide encapsulation layer 206, the portions of the first semiconductor die 100 that are physically exposed to the inter-die trenches 109, the first protective annular spacer 107 (if present), and the second protective annular spacer 207 (if present) by performing a wet etch process in which an isotropic etchant is introduced into the inter-die trenches 109 through end portions of the inter-die trenches 109 (e.g., the peripheral slit-shaped openings 111).

In one embodiment, the isotropic selective etch process may comprise a wet etch process that is performed in a wet etch tank while at the bonded assembly is held in place by at least one substrate holder. For example, the first substrate 108 may be held in place by at least one first substrate holder 910 and/or the second substrate 208 may be held in place by at least one second substrate holder 920. In one embodiment, the planar sacrificial spacer layer 5 comprises, and/or consists of a semiconductor material including silicon at an atomic percentage greater than 50% (such as amorphous silicon, polysilicon or a silicon-germanium alloy), and the wet etch process may employ an isotropic etchant that etches silicon-containing semiconductor materials selective to dielectric materials or metallic materials. In an illustrative example, the wet etch process may employ potassium hydroxide, trimethyl-2 hydroxyethyl ammonium hydroxide (TMY), or tetramethyl ammonium hydroxide (TMAH). Generally, an isotropic etchant may be employed which etches the material of the planar sacrificial spacer layer 5 selective to the first silicon oxide encapsulation layer 6, the second silicon oxide encapsulation layer 206, the various materials of the first semiconductor die 100 that are physically exposed to the inter-die trenches 109, the material of the first protective annular spacer 107 (if present), and the material of the second protective annular spacer 207 (if present).

The duration of the wet etch process may be selected such that the entirety of the planar sacrificial spacer layer 5 is etched. The various materials of the etch stop material layer 4, the first silicon oxide encapsulation layer 6, the second silicon oxide encapsulation layer 206, the portions of the first semiconductor die 100 that are physically exposed to the inter-die trenches 109, the first protective annular spacer 107 (if present), and the second protective annular spacer 207 (if present) may be collaterally etched and thinned during the wet etch process. Generally, the thicknesses of the various collaterally etched portions of the exemplary structure can be selected such that the collaterally etched portions of the exemplary structure are not etched completely through during the wet etch process, while the entirety of the planar sacrificial spacer layer 5 is removed by the wet etch process. A horizontally-extending cavity 19 can be formed in the volume from which the planar sacrificial spacer layer 5 is removed.

Figure 13:
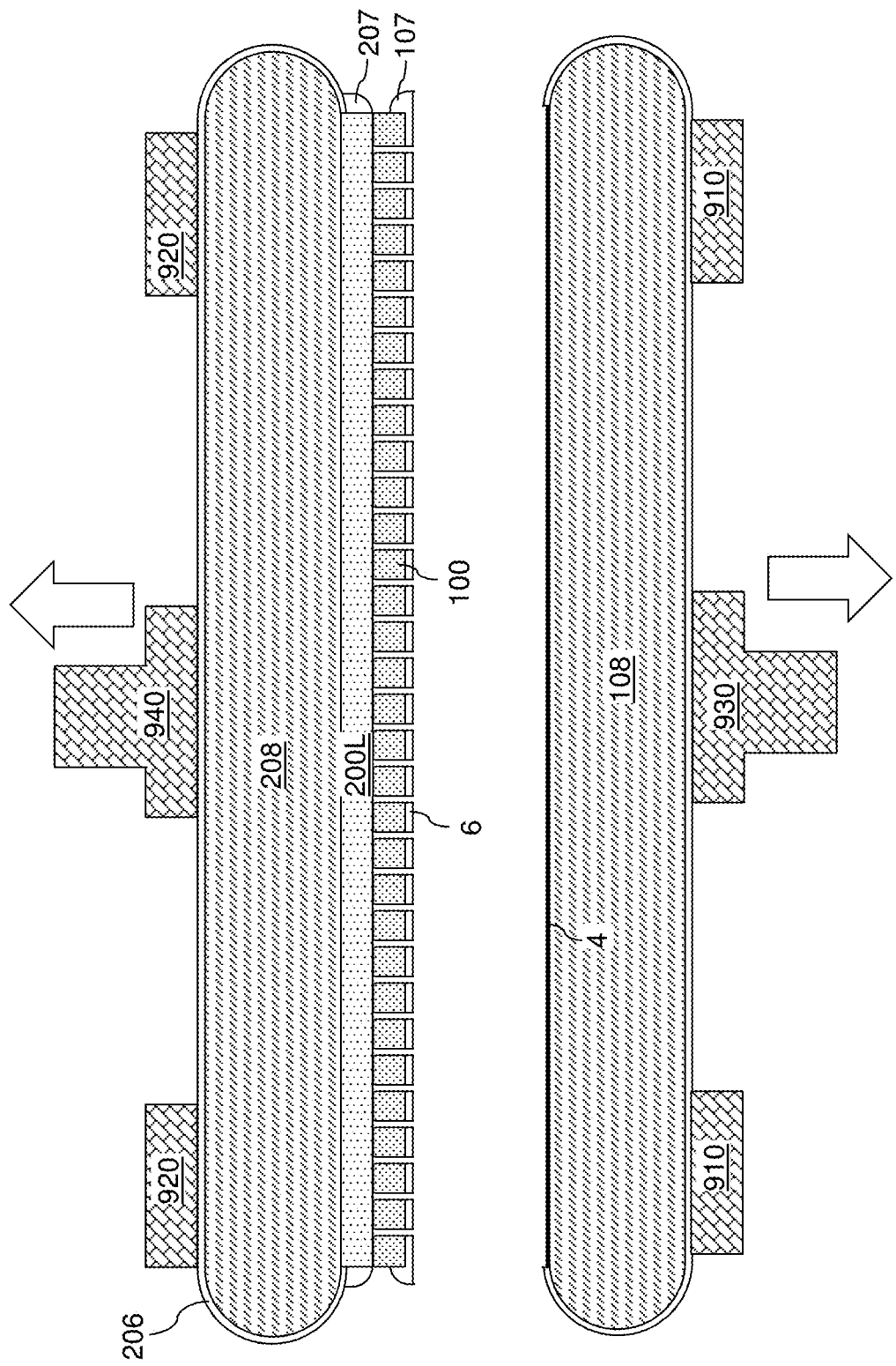
FIG. 13 is a vertical cross-sectional view of the exemplary structure after detaching the first substrate from an assembly including the second wafer and an array of bonded semiconductor dies according to an embodiment of the present disclosure.

Referring to FIG. 13, the first substrate 108 can be detached from an assembly including the second substrate 208 and an array of bonded semiconductor dies (100, 200). For example, the first substrate 108 can be removed from (e.g., pulled apart from) an assembly of the second substrate 208, the array of second semiconductor dies 200, and the array of first semiconductor dies 100 after removal of the planar sacrificial spacer layer 5. In one embodiment, the first substrate 108 may be removed from the assembly including the second substrate 208 and the array of bonded semiconductor dies (100, 200) while the first silicon oxide encapsulation layer 6 is present on the first substrate 108 and over a horizontally-extending cavity 19 formed by removal of the planar sacrificial spacer layer 5. In one embodiment, a vertically-extending peripheral portion of the first silicon oxide encapsulation layer 6 that is located at a periphery of the front surface of the first substrate 108 may be torn apart during removal (e.g., pulling) of the first substrate 108 from the assembly.

In one embodiment, the first substrate 108 may be pulled apart from the assembly after the first substrate 108 and the assembly are removed from tank containing the isotropic etchant employed for the wet etch process. Respective chucks (e.g., electrostatic chucks, etc.) 930 and 940 are applied to the back sides of the respective first and second substrates 108 and 208. Pulling force in the opposite directions (schematically shown by the arrows) may be applied to at least one of the chucks 930 and 940 to pull apart the first substrate 108 from the assembly of the second wafer 208 and the array of bonded semiconductor dies (100, 200). The first semiconductor dies 100 in the assembly are laterally spaced apart from each other by inter-die trenches 109. The second semiconductor dies 200 in the bonded assembly are interconnected with each other as portions of the device layer 200L.

Once the first substrate 108 is detached from the assembly including the second wafer 208 and the array of bonded semiconductor dies (100, 200), material layers other than the first substrate 108 can be removed employing various etch processes such as wet etch processes. For example, the etch stop material layer 4 can be removed selective to the material of the first substrate 108 after the first substrate 108 is detached from the assembly by performing a first isotropic etch process. In an illustrative example, the etch stop material layer 4 includes silicon nitride, and the first isotropic etch process may employ hot phosphoric acid as an isotropic etchant. The remaining portion of the first silicon oxide encapsulation layer 6 on the first substrate 108 can be removed selective to the material of the first substrate 108 after the first substrate 108 is pulled apart from the assembly by performing a second isotropic etch process. In an illustrative example, a wet etch process employing dilute hydrofluoric acid can be performed to remove the remaining portion of the first silicon oxide encapsulation layer 6 from the first substrate 108.

Upon removal of all material layers thereupon, the first substrate 108 consists of the substrate material (e.g., single crystalline silicon) as originally provided prior to the processing steps described with reference to FIG. 1. The first substrate 108 can be reused for manufacture of additional semiconductor devices. As such, the first substrate 108 may be recycled without significant damage, thus reducing process cost. In case the first silicon oxide encapsulation layer 6 is formed by deposition of a silicon oxide material, the volume of the first substrate 108 after removal of the residual material layers may be the same as the volume of the first substrate prior to the processing steps described with reference to FIG. 1. Thus, the first substrate 108 may not be consumed or thinned in any way during use throughout the processing steps of FIGS. 1-13. In case the first silicon oxide encapsulation layer 6 is formed by thermal or plasma oxidation, the thinning of the first substrate 108 during the processing steps of FIGS. 1-13 may be minimal. For example, the thinning of the first substrate 108 may be less than 5 microns after performing the processing steps of FIGS. 1-13. Thus, the methods of the embodiments of the present disclosure provide repeated reuse of the first substrate 108.

Figure 14:
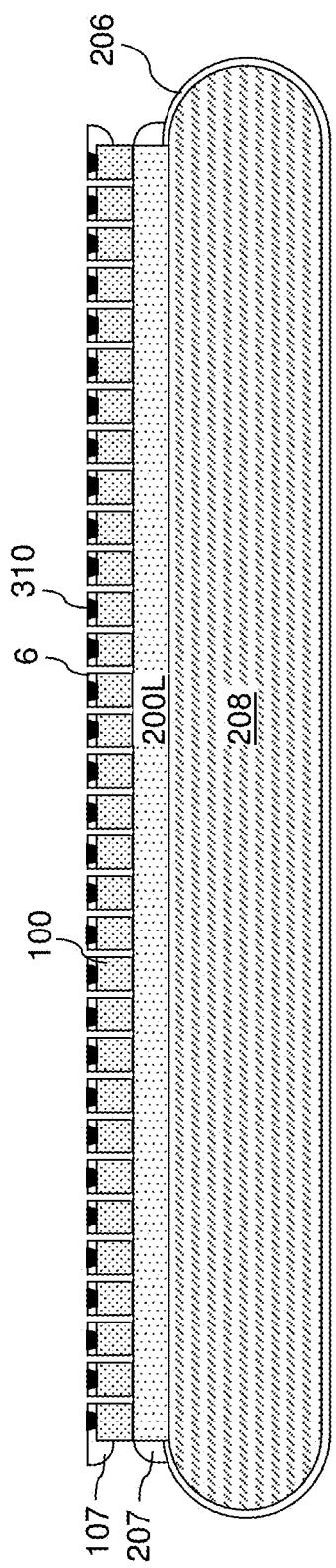
FIG. 14 is a vertical cross-sectional view of the exemplary structure after thinning the backside of the second substrate according to an embodiment of the present disclosure.

Referring to FIG. 14, the assembly of the second substrate 208 and the array of bonded semiconductor dies (100, 200) can be further processed. For example, a dielectric fill material, such as silicon oxide, may be formed in the inter-die trenches 109. Optionally, contact via structures (not illustrated) contacting semiconductor devices in the first semiconductor dies 100 may be formed through the first silicon oxide encapsulation layer 6. For example source contacts 310 may be provided through the first encapsulation layer 6 to contact the horizontal semiconductor layer 110, which functions as a source layer of the memory device 240.

Figure 15:
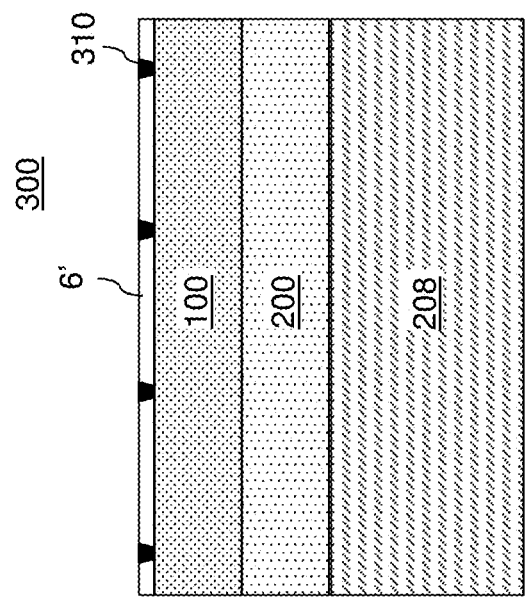
FIG. 15 is a vertical cross-sectional view of a semiconductor chip that is obtained by dicing the exemplary structure of FIG. 14.

Referring to FIG. 15, a semiconductor chip 300 including a bonded assembly of a first semiconductor die 100 and a second semiconductor die 200 is illustrated. A plurality of semiconductor chips may be obtained by dicing the assembly of the thinned second substrate 208 and the array of bonded semiconductor dies (200, 200) as provided in the exemplary structure of FIG. 14. The semiconductor chip may comprise a silicon oxide layer 6', which is a diced portion of the first silicon oxide encapsulation layer 6. The silicon oxide layer 6' may, or may not, be removed.

The assembly may then be diced along the respective overlapping first and second dicing channels DC and DC' illustrated in FIGS. 4B and 9B. Generally, the second dicing channels DC' in the device layer 200L (which include the two-dimensional array of second semiconductor dies 200) overlap with the inter-die trenches 109 located in the areas of the first dicing channels DC in a plan view along a vertical direction. The vertical direction the direction that is perpendicular to the bonding interfaces between the first semiconductor dies 100 and the second semiconductor dies 200.

Referring to FIG. 15, a semiconductor chip 300 including a bonded assembly of a first semiconductor die 100 and a second semiconductor die 200 is illustrated. A plurality of semiconductor chips 300 may be obtained by dicing the assembly of the second substrate 208 and the array of bonded semiconductor dies (100, 200) as provided in the exemplary structure of FIG. 14. The semiconductor chip 300 may comprise a silicon oxide layer 6', which is a diced portion of the first silicon oxide encapsulation layer 6.

The various embodiments of the present disclosure can be employed to form first semiconductor dies that are formed on a first substrate and are transferred to a second substrate through bonding to second semiconductor dies provided on the second substrate. The first substrate can be detached from an assembly of the second substrate, the second semiconductor dies, and the first semiconductor dies, and can be subsequently cleaned for reuse. The present disclosure provides a semi-permanent substrate recycling scheme that can be employed to facilitate wafer-to-wafer bonding without consuming a transfer wafer such as the first substrate.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of forming a semiconductor structure, comprising:
   forming an etch stop material layer and a planar sacrificial spacer layer over a front surface of a first substrate;
   forming a first insulating encapsulation layer over the planar sacrificial spacer layer and on a backside surface and a side surface of the first substrate;
   forming a continuous structure including first semiconductor devices over a top surface of the first insulating encapsulation layer;
   etching inter-die trenches within the continuous structure to divide the continuous structure;
   bonding the divided continuous structure to second semiconductor devices located over a second substrate;
   removing the planar sacrificial spacer layer selective to the etch stop material layer and the first insulating encapsulation layer by performing a wet etch process in which an isotropic etchant is introduced into the inter-die trenches;
   detaching the first substrate from an assembly of the second substrate, the second semiconductor devices, and the divided continuous structure after the removing the planar sacrificial spacer layer; and
   forming a second insulating encapsulation layer on the second substrate prior to formation of the array of second semiconductor dies on the second substrate;
   wherein:
   the divided continuous structure comprises a two-dimensional array of first semiconductor dies that are laterally spaced apart from each other by the inter-die trenches;
   the second semiconductor devices comprise an array of second semiconductor dies;
   the step of bonding comprises bonding the two-dimensional array of first semiconductor dies to the array of second semiconductor dies;
   the second insulating encapsulation layer is formed as a single continuous material layer that encapsulates the second substrate;
   the method further comprises removing a horizontally-extending portion of the second insulating encapsulation layer from a front surface of the second substrate; and
   the array of second semiconductor dies is formed directly on the front surface of the second substrate.

2. A method of forming a semiconductor structure, comprising:
   forming an etch stop material layer and a planar sacrificial spacer layer over a front surface of a first substrate;
   forming a first insulating encapsulation layer over the planar sacrificial spacer layer and on a backside surface and a side surface of the first substrate;
   forming a continuous structure including first semiconductor devices over a top surface of the first insulating encapsulation layer;
   etching inter-die trenches within the continuous structure to divide the continuous structure;
   bonding the divided continuous structure to second semiconductor devices located over a second substrate;
   removing the planar sacrificial spacer layer selective to the etch stop material layer and the first insulating encapsulation layer by performing a wet etch process in which an isotropic etchant is introduced into the inter-die trenches; and
   detaching the first substrate from an assembly of the second substrate, the second semiconductor devices, and the divided continuous structure after the removing the planar sacrificial spacer layer;
wherein:
the divided continuous structure comprises a two-dimensional array of first semiconductor dies that are laterally spaced apart from each other by the inter-die trenches;
the second semiconductor devices comprise an array of second semiconductor dies;
the step of bonding comprises bonding the two-dimensional array of first semiconductor dies to the array of second semiconductor dies; and
the first substrate is detached by being pulled apart from the assembly while the first insulating encapsulation layer is present on the first substrate and over a horizontally-extending cavity formed by removal of the planar sacrificial spacer layer.

3. The method of claim 2, wherein a vertically-extending peripheral portion of the first insulating encapsulation layer that is located at a periphery of the front surface of the first substrate is torn apart during the detaching of the first substrate from the assembly.

4. The method of claim 2, further comprising:
removing the etch stop material layer selective to a material of the first substrate after the first substrate is detached from the assembly; and
removing a remaining portion of the first insulating encapsulation layer on the first substrate selective to the material of the first substrate after the first substrate is detached from the assembly.

5. The method of claim 2, further comprising reusing the first substrate by forming additional semiconductor devices on the first substrate after removing the etch stop material layer and a remaining portion of the first insulating encapsulation layer.

6. The method of claim 2, further comprising forming contacts on the two-dimensional array of first semiconductor dies after the detaching the first substrate.

7. The method of claim 2, further comprising dicing a combination of the two-dimensional array of first semiconductor dies, the second substrate and the array of second semiconductor dies along dicing channels, wherein the dicing channels overlap with the inter-die trenches in a plan view along a vertical direction that is perpendicular to bonding interfaces between the first dies and the second dies.

8. The method of claim 2, wherein:
the first semiconductor devices comprise three-dimensional memory devices; and
the second semiconductor devices comprise peripheral circuitry for operation of the three-dimensional memory devices.

9. A method of forming a semiconductor structure, comprising:
forming an etch stop material layer and a planar sacrificial spacer layer over a front surface of a first substrate;
forming a first insulating encapsulation layer over the planar sacrificial spacer layer and on a backside surface and a side surface of the first substrate;
forming a continuous structure including first semiconductor devices over a top surface of the first insulating encapsulation layer;
etching inter-die trenches within the continuous structure to divide the continuous structure;
bonding the divided continuous structure to second semiconductor devices located over a second substrate;
removing the planar sacrificial spacer layer selective to the etch stop material layer and the first insulating encapsulation layer by performing a wet etch process in which an isotropic etchant is introduced into the inter-die trenches; and
detaching the first substrate from an assembly of the second substrate, the second semiconductor devices, and the divided continuous structure after the removing the planar sacrificial spacer layer;
wherein:
the etch stop material layer is formed by an anisotropic deposition process that deposits an etch stop material on the front surface of the first substrate and does not deposit the etch stop material on a backside surface of the first substrate;
the first insulating encapsulation layer is formed as a single continuous material layer that encapsulates the first substrate, the etch stop material layer, and the planar sacrificial spacer layer;
each of the first substrate and the planar sacrificial spacer layer comprises silicon; and
the insulating encapsulation layer is formed by oxidation of surface portions of the first substrate and the planar sacrificial spacer layer such that a thickness of the insulating encapsulation layer is greater than one half of a thickness of the etch stop material layer.

* * * * *